US008357558B2

(12) United States Patent
Kyono et al.

(10) Patent No.: US 8,357,558 B2
(45) Date of Patent: Jan. 22, 2013

(54) METHOD OF MAKING SEMICONDUCTOR LIGHT-EMITTING DEVICE

(75) Inventors: Takashi Kyono, Itami (JP); Yohei Enya, Itami (JP); Yusuke Yoshizumi, Itami (JP); Katsushi Akita, Itami (JP); Masaki Ueno, Itami (JP); Takamichi Sumitomo, Itami (JP); Masahiro Adachi, Osaka (JP); Shinji Tokuyama, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 370 days.

(21) Appl. No.: 12/837,248

(22) Filed: Jul. 15, 2010

(65) Prior Publication Data
US 2011/0076788 A1 Mar. 31, 2011

(30) Foreign Application Priority Data
Sep. 30, 2009 (JP) ................................ 2009-228764

(51) Int. Cl.
*H01L 21/00* (2006.01)
(52) U.S. Cl. ........................ 438/47; 438/7; 257/E33.003
(58) Field of Classification Search ................ 438/7, 47; 257/E33.003
See application file for complete search history.

(56) References Cited

U.S. PATENT DOCUMENTS 7,846,757 B2 * 12/2010 Farrell et al. .................... 438/46
2010/0213439 A1 * 8/2010 Ueno et al. ....................... 257/13

FOREIGN PATENT DOCUMENTS

JP 11-112029 A 4/1999

(Continued)

OTHER PUBLICATIONS

Funato, Mitsuru et al., "Blue, Green, and Amber InGaN/GaN Light-Emitting Diodes on Semipolar (1122) GaN Bulk Substrates," Japanese Journal of Applied Physics, vol. 45, No. 26, 2006, pp. L659-L662.

(Continued)

*Primary Examiner* — Matthew C. Landau
*Assistant Examiner* — Daniel Luke
(74) *Attorney, Agent, or Firm* — Venable LLP; Michael A. Sartori

(57) ABSTRACT

A method of making a semiconductor light-emitting device involves the steps of selecting at least one tilt angle for a primary surface of a substrate to evaluate the direction of piezoelectric polarization in a light-emitting layer, the substrate comprising a group III nitride semiconductor; preparing a substrate having the primary surface, the primary surface having the selected tilt angle, and the primary surface comprising the group III nitride semiconductor; forming a quantum well structure and p- and n-type gallium nitride semiconductor layers for the light-emitting layer at the selected tilt angle to prepare a substrate product; measuring photoluminescence of the substrate product while applying a bias to the substrate product, to determine bias dependence of the photoluminescence; evaluating the direction of the piezoelectric polarization in the light-emitting layer at the selected tilt angle on the primary surface of the substrate by the determined bias dependence; determining which of the primary surface or the back surface of the substrate is to be used, based on the evaluation to select a plane orientation of a growth substrate for making the semiconductor light-emitting device; and forming a semiconductor laminate for the semiconductor light-emitting device on the primary surface of the growth substrate. The tilt angle is defined by the primary surface of the substrate and the (0001) plane of the group III nitride semiconductor. Each of the well layer and the barrier layer of the light-emitting layer extends along a reference plane tilting from a plane perpendicular to a reference axis extending along the c-axis of the group III nitride semiconductor.

20 Claims, 17 Drawing Sheets

FOREIGN PATENT DOCUMENTS

| | | |
|---|---|---|
| JP | 2009-200337 A | 9/2009 |
| JP | 2009-218284 A | 9/2009 |
| JP | 4333820 B1 | 9/2009 |

OTHER PUBLICATIONS

Tyagi, Anurag et al., "Semipolar (1011) InGaN/GaN Laser Diodes on Bulk GaN Substrates," Japanese Journal of Applied Physics, vol. 46, No. 19, 2007, pp. L444-L445.

Enya et al., "531 nm Green Lasing of InGaN Based Laser Diodes on Semi-Polar {20-21} Free-Standing GaN Substrates," Applied Physics Express, vol. 2, pp. 082101-1-082101-3 (2009).

Yoshizumi et al., "Continuous-Wave Operation of 520 nm Green InGaN-Based Laser Diodes on Semi-Polar {20-21} GaN Substrates," Applied Physics Express, vol. 2, pp. 092101-1-092101-3 (2009).

"Green Semiconductor Laser Moving Toward Practical Application—Sumitomo Electric Industries, Ltd.," Published in: Nikkan Kogyo Shinbun (Aug. 20, 2009).

"Green Semiconductor Laser Oscillates at Last Sumitomo Electric Succeeded in Pulse Driving," Published in: Nikkei Electronics (Aug. 24, 2009).

* cited by examiner (a)

| | DEVICE1 | DEVICE2 | DEVICE3 | DEVICE4 | DEVICE5 | DEVICE6 | DEVICE7 | DEVICE8 | DEVICE9 |
|---|---|---|---|---|---|---|---|---|---|
| PLANE ORIENTATION | (10-12) | (0001) | (11-22) | (10-11) | (20-21) | (10-10) | (20-2-1) | (20-21) | (20-2-1) |
| OFF-ANGLE (DEGREE) | 43 (m-axis direction) | 0 | 58 (a-axis direction) | 62 (m-axis direction) | 75 (m-axis direction) | 90 (m-axis direction) | 105 (m-axis direction) | 75 (m-axis direction) | 105 (m-axis direction) |
| EMISSION WAVELENGTH (nm) | ABOUT500 | ABOUT500 | ABOUT500 | ABOUT500 | ABOUT500 | ABOUT500 | ABOUT500 | ABOUT400 | ABOUT400 |

(a)

(b)

(c)

(d)

METHOD OF MAKING SEMICONDUCTOR LIGHT-EMITTING DEVICE

BACKGROUND OF THE INVENTION

1. Field of the Invention

The present invention relates to a method of making a semiconductor light-emitting device.

2. Related Background Art

Non-patent Literature 1 discloses a light-emitting diode that uses a GaN substrate. The light-emitting diode is formed on the (11-2-2) plane of the GaN substrate. The (11-2-2) plane is semipolar. The light-emitting diode includes a light-emitting layer having a single quantum well structure composed of InGaN/GaN, and has an emission wavelength of 600 nm.

Non-patent Literature 2 discloses a laser diode that uses a GaN substrate. The laser diode is formed on the (10-1-1) plane of the GaN substrate. The (10-1-1) plane is semipolar. The laser diode includes a light-emitting layer having a multiple-quantum well structure composed of InGaN/GaN, and has an emission wavelength of 405.9 nm (bluish violet).

Non-patent Literature 1: Mitsuru FUNATO et. al. "Blue, Green, and Amber InGaN/GaN Light-Emitting Diodes on Semipolar (11-22) GaN Bulk Substrates", Japanese Journal of Applied Physics, Vol. 45, No. 26, 2006, pp. L659-L662

Non-patent Literature 2: Anurag TYAGI et. al, "Semipolar (10-1-1) InGaN/GaN Laser Diodes on Bulk GaN Substrates," Japanese Journal of Applied Physics, Vol. 46, No. 19, 2007, pp. L444-L445

SUMMARY OF THE INVENTION

As is disclosed in Non-patent Literatures 1 and 2, gallium nitride semiconductor light-emitting devices are formed on semipolar surfaces of GaN substrates. The gallium nitride semiconductors exhibit piezoelectric polarization, which exerts various influences on their light-emitting characteristics.

In light-emitting devices formed on c-planes, the piezoelectric polarization causes a shift of a light-emitting wavelength, such as blue shift, and leads to spatial separation between a wave function for holes and that for electrons, resulting in a decreased light-emitting efficiency. The present inventors, however, have discovered that the absence of the piezoelectric polarization is not necessarily favorable, but the piezoelectric polarization can sometimes be utilized for improving some light-emitting characteristics. Specifically, the piezoelectric polarization sometimes influences not only one aspect of the light-emitting characteristics but also several aspects thereof. It is sometimes desired to improve one particular characteristic of light-emitting characteristics over the others in some cases, and in other cases, it is desired to preferably adjust light-emitting characteristics among which trade-offs are.

The piezoelectric polarization is concerned with strains incorporated in crystals. The stress in a light-emitting layer in a light-emitting device depends on the plane orientation of a primary surface of a substrate of the semiconductor light-emitting device and the structure of the semiconductor laminate grown on the primary surface of the substrate, and the light-emitting characteristics are associated with, for example, the direction of the piezoelectric polarization in the light-emitting layer. It is not easy to empirically estimate the direction of piezoelectric polarization in the actual semiconductor laminate used in the light-emitting device.

An object of the invention, which has been accomplished in consideration of such a background, is to provide a method of making a semiconductor light-emitting device, in which an appropriate orientation of piezoelectric polarization in an active layer can be selected.

One aspect of the present invention provides a method of making a semiconductor light-emitting device. The method includes the steps of: (a) selecting one or more tilt angles for a primary surface of a substrate of a group III nitride semiconductor in order to estimate a direction of piezoelectric polarization in a light-emitting layer; (b) preparing one or more substrates, a primary surface of each substrate comprising the group III nitride semiconductor, the one or more substrates having the one or more selected tilt angles, respectively; (c) growing a quantum well structure for the light-emitting layer, and p- and n-type gallium nitride semiconductor layers in order to prepare one or more substrate products for the selected tilt angles; (d) measuring a photoluminescence spectrum of each substrate product while applying a bias to the substrate product, to determine bias dependence of the photoluminescence spectrum; (e) evaluating a direction of the piezoelectric polarization in the light-emitting layer at the selected tilt angle on the primary surface of each substrate from the determined bias dependence; (f) selecting a plane orientation of a growth substrate by determining which of the primary surface or a back surface of the substrate is to be used for a tilt angle for the semiconductor light-emitting device, the determination being made using the evaluation, the back surface being opposite to the primary surface, and the growth substrate being prepared for making the semiconductor light-emitting device; and (g) forming a semiconductor laminate for the semiconductor light-emitting device on the primary surface of the growth substrate. The primary surface of the growth substrate comprises the group III nitride semiconductor, and the tilt angle is defined by an angle between the primary surface of the substrate and the (0001) plane of the group III nitride semiconductor. The semiconductor laminate comprises a first group III nitride semiconductor region, a light-emitting layer, and a second group III nitride semiconductor region, and the light-emitting layer is provided between the first group III nitride semiconductor region and the second group III nitride semiconductor region. The light emitting layer comprises a well layer and a barrier layer. Each of the well layer and the barrier layer extends along a reference plane, the reference plane tilts with respect to a plane perpendicular to a reference axis, and the reference axis extends in a direction of the c-axis of the group III nitride semiconductor. The well layer comprises a first gallium nitride semiconductor and being strained. The barrier layer comprises a second gallium nitride semiconductor, and the second gallium nitride semiconductor is differing from the first gallium nitride semiconductor. The first group III nitride semiconductor region comprises at least one n-type group III nitride semiconductor layer, and the second group III nitride semiconductor region comprises at least one p-type group III nitride semiconductor layer.

According to the method, the photoluminescence of the substrate product is measured while a bias is applied to the substrate product. The method can determine the dependence of the photoluminescence on the bias. The bias-dependence of the photoluminescence contains information about the direction of the piezoelectric polarization. Evaluation on the direction of the piezoelectric polarization determines which of the primary surface and the back surface of the substrate is to be used for the tilt angle. Subsequently, the plane orientation of the growth substrate is selected for making the semiconductor device. After an appropriate direction of the piezoelectric polarization in the light-emission layer has been selected, the semiconductor laminate for the semiconductor light-emitting device is formed on the primary surface of the growth substrate.

The method of the present invention further includes a step of categorizing a angular range according to the positive or negative sign of the piezoelectric polarization based on the evaluation of the direction of the piezoelectric polarization, and the selected tilt angles are in an angular range. The determination is carried out based on the categorization.

The evaluation of the direction of the piezoelectric polarization in accordance with the method provides the positive or negative sign of the piezoelectric polarization. The angular range are categorized into angular ranges of positive polarization and/or angular ranges of negative polarization depending on the signs.

The method of the present invention can fabricate the substrate product using a group III nitride substrate. The method can determine the sign of the piezoelectric polarization indicating the relation between the group III nitride substrate and the light-emitting layer.

In the method of the present invention, the light-emitting layer can emit light of a wavelength in the range of 460 nm to 550 nm. The piezoelectric polarization in the active layer can be oriented to an appropriate direction in response to the wavelength range.

In the method of the present invention, plural angles indicating two or more plane orientations can be selected in the step of selecting the tilt angles. The directions of the piezoelectric polarization at the two angles allow the evaluation of the sign of the piezoelectric polarization the angle range between two angles among the plural angles. Alternatively, in the method of the present invention, plural angles indicating three or more plane orientations can be selected in the step of selecting the tilt angles. The directions of the piezoelectric polarization at the plural angles allow the evaluation of the sign of the piezoelectric polarization between every two adjacent angles among the plural angles: for example, positive polarization in one angular range and negative polarization in the other angular range; positive polarization at both angular ranges; and negative polarization at both angular ranges.

In the method of the present invention, the plane orientation of the growth substrate can tilt in the angular range of 40 degrees to 140 degrees. The method can determine the sign of the piezoelectric polarization in the above angular range of the practical orientation away from the polar surface.

In the method of the present invention, the well layer comprises InGaN, and the barrier layer comprises InGaN or GaN. The well layer incorporates compressive strain therein caused by the stress from the barrier layer, and the substrate product is fabricated using a GaN substrate. The method can determine the sign of the piezoelectric polarization in an active layer composed of InGaN or GaN, which is practically suitable for the active layer.

In the method of the present invention, the primary surface of the growth substrate can be selected such that the direction of the piezoelectric polarization corresponds to a direction from the n-type group III nitride semiconductor layer to the p-type group III nitride semiconductor layer.

This method can allows the selectable use of a tilt angle corresponding to the primary surface of the substrate or a tilt angle corresponding to the back surface of the primary surface of the substrate to provide the well layer with a desired piezoelectric polarization, and the selectable use can be made based on the evaluation of the direction of the piezoelectric polarization.

In the method of the present invention, the light-emitting layer has a multiple-quantum well structure, and preferably the barrier layer and the well layer have a band gap difference of 0.7 eV or more.

The light-emitting layer having a band gap difference of at least 0.7 eV can supply electrons to the entire multiple-quantum well structure in the method.

The method of the present invention can further includes a step of, if the evaluation demonstrates that the direction of the piezoelectric polarization corresponds to a positive direction from the n-type group III nitride semiconductor layer to the p-type group III nitride semiconductor layer at a part or whole of the tilt angle range including the selected tilt angle, preparing a substrate as a growth substrate and the prepared substrate has a primary surface that provides a tilt angle exhibiting the positive direction of the piezoelectric polarization.

In accordance with the method, the growth substrate to be prepared has a primary surface that provides a tilt angle exhibiting positive piezoelectric polarization if the desired piezoelectric polarization lies in the positive direction.

The method of the present invention further includes a step of, if the evaluation demonstrates that the direction of the piezoelectric polarization corresponds to a negative direction from the p-type group III nitride semiconductor layer to the n-type group III nitride semiconductor layer at a part or whole of the tilt angle range including the selected tilt angles, preparing a substrate as a growth substrate and the substrate has a primary surface that provides a back side opposite to the plane orientation of a tilt angle exhibiting the negative direction of the piezoelectric polarization.

In accordance with the method, the growth substrate to be prepared has a primary surface that provides the back side opposite to the plane orientation of a tilt angle exhibiting negative piezoelectric polarization if the desired piezoelectric polarization lies in the positive direction.

In the method of the present invention, preferably the plane orientation of the growth substrate lies in the angular range of 40 degrees to 50 degrees or 90 degrees to 130 degrees. In the method, electrons can be supplied to the entire multiple-quantum well structure by use of the positive piezoelectric polarization. In the method of the present invention, the plane orientation of the growth substrate can be any one of the (10-12) plane, (11-2-2) plane, (10-1-1) plane, and (20-2-1) plane.

In the method of the present invention, the primary surface of the growth substrate can be selected such that the direction of the piezoelectric polarization corresponds to a direction the p-type group III nitride semiconductor layer to the n-type group III nitride semiconductor layer.

In the method, the evaluation of the direction of the piezoelectric polarization allows the selectable use of a tilt angle corresponding to the primary surface of the substrate or a tilt angle corresponding to a back side opposite to the primary surface of the substrate based so as to provide a desired piezoelectric polarization in the well layer.

The method of the present invention further includes a step of, if the evaluation demonstrates that the direction of the piezoelectric polarization corresponds to a positive direction from the n-type group III nitride semiconductor layer to the p-type group III nitride semiconductor layer at a part or whole of the tilt angle range including the selected angles, preparing a substrate as a growth substrate, and the substrate has a primary surface that provides a back side opposite to the plane orientation of a tilt angle exhibiting the piezoelectric polarization in the positive direction.

In accordance with the method, if the desired piezoelectric polarization is oriented in the negative direction, the growth substrate to be prepared has a primary surface that provides the back side opposite to the plane orientation of a tilt angle exhibiting positive piezoelectric polarization.

The method of the present invention can further includes a step of, if the evaluation demonstrates that the direction of the piezoelectric polarization corresponds to a negative direction from the p-type group III nitride semiconductor layer to the n-type group III nitride semiconductor layer at a part or whole of the tilt angle range including the selected tilt angles, preparing a substrate as a growth substrate and the substrate has a primary surface that provides a tilt angle exhibiting the negative direction of the piezoelectric polarization.

In accordance with the method, the growth substrate to be prepared has a primary surface that provides a tilt angle exhibiting negative piezoelectric polarization if the desired piezoelectric polarization is in the negative direction.

In the method of the present invention, the second group III nitride semiconductor region includes a gallium nitride based semiconductor layer having a band gap greater than that of the barrier layer. The gallium nitride based semiconductor layer in the second group III nitride semiconductor region is adjacent to the light-emitting layer. The gallium nitride based semiconductor layer includes an electron blocking layer. The primary surface of the growth substrate has an angular range of 63 degrees to 80 degrees, and the substrate product may be fabricated using a GaN substrate. This method allows the electron blocking layer to apply compressive strain on the light-emitting layer because the gallium nitride based semiconductor is adjacent to the light-emitting layer. In this method, using the negative piezoelectric polarization enables the selection of an emission wavelength from a wide wavelength range and the reduction in the leakage of electrons from the light-emitting layer. This method can enhance the incorporation of indium in such an angular range. The semipolar primary surface may be, for example, the (20-21) plane, in the method of the present invention.

In the method of the present invention, the tilt angle is defined as an angle at which the c-axis tilts toward the direction of the m-axis of the group III nitride semiconductor.

Alternatively, in the method of the present invention, the tilt angle is defined as an angle at which the c-axis tilts toward the direction of the a-axis of the group III nitride semiconductor.

The above objects and the other objects, features, and advantages of the present invention can more readily become apparent in view of the following detailed description of the preferred embodiments of the present invention proceeding with reference to the accompanying drawings.

BRIEF DESCRIPTION OF THE DRAWINGS

FIG. 8 is a drawing showing plain orientations and off-angles α of the primary surfaces, and emission wavelength bands of Devices 1 to 9;

DESCRIPTION OF THE PREFERRED EMBODIMENTS

The teaching of the present invention can be readily understood from the following description with reference to the accompanying drawings by way of example. Embodiments of a method of making a semiconductor light-emitting device will be explained with reference to the accompanying drawings. The same reference numbers are assigned to the same parts, if possible.

Figure 1:
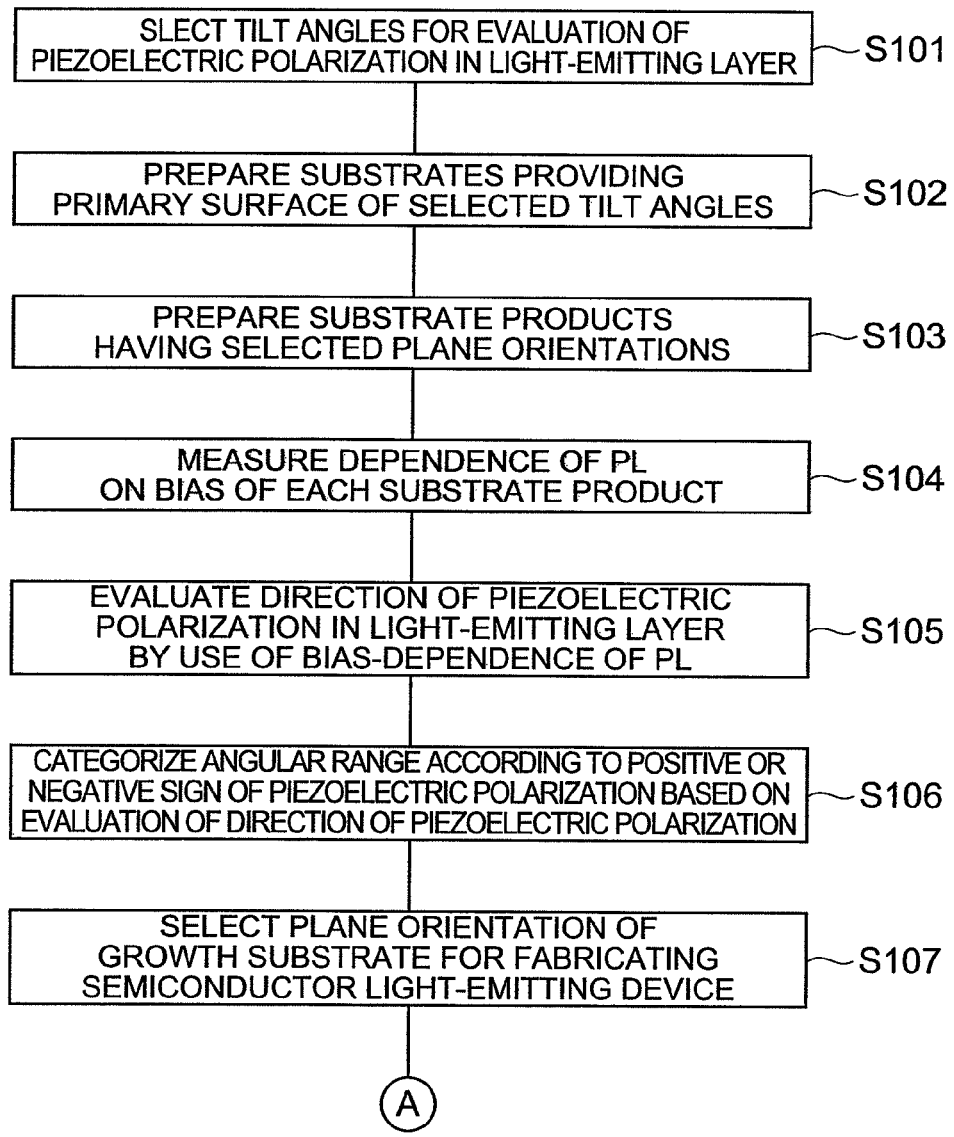
FIG. 1 is a diagram of major steps of a method of making a group III nitride semiconductor light-emitting device in accordance with an embodiment.
Figure 2:
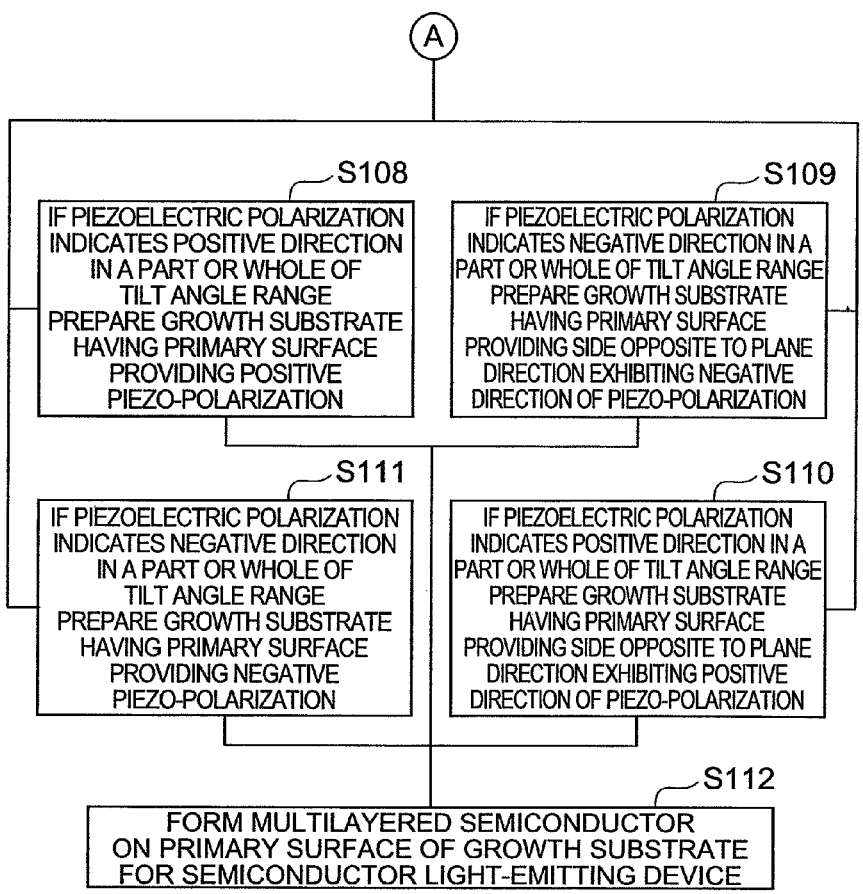
FIG. 2 is a diagram of major steps of a method of making a group III nitride semiconductor light-emitting device in accordance with an embodiment.

FIGS. 1 and 2 are diagrams of major steps of a method of making a group III nitride semiconductor light-emitting device in accordance with an embodiment. The method in which an appropriate direction of piezoelectric polarization in an active layer can be selected will be explained below. Step S101 to Step S111 show a procedure of selecting a desired direction of piezoelectric polarization in the active layer is shown, and Step S112 shows formation of a group III nitride semiconductor light-emitting device. After the formation of the group III nitride semiconductor light-emitting device shown in Step S112 is described, the procedure for directing the piezoelectric polarization to an appropriate direction is explained.

Figure 3:
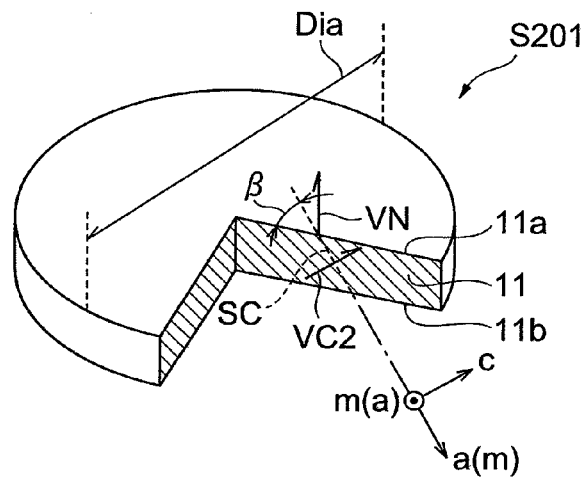
FIG. 3 is a drawing illustrating major steps of the method of forming a nitride semiconductor light-emitting device and a method of forming an epitaxial wafer in accordance with an embodiment.
Figure 3:
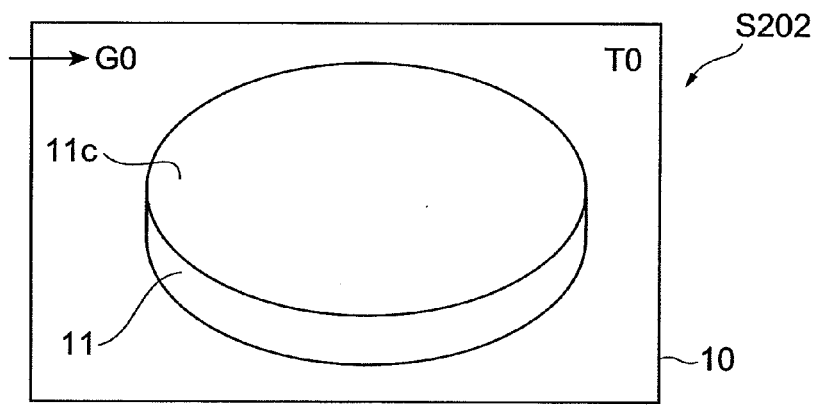
Figure 3:
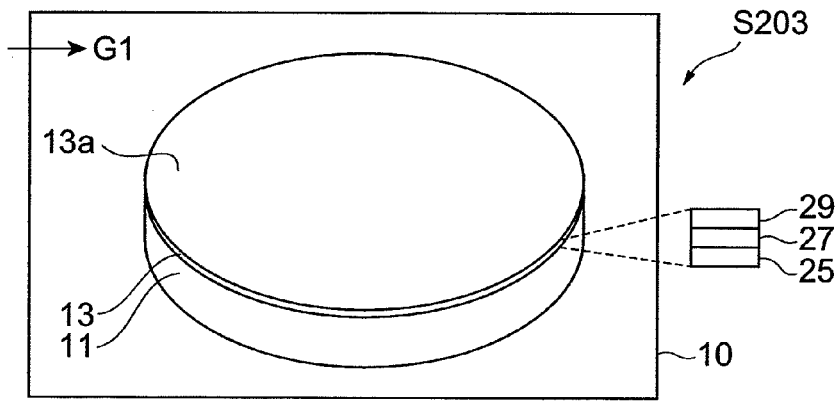
Figure 5:
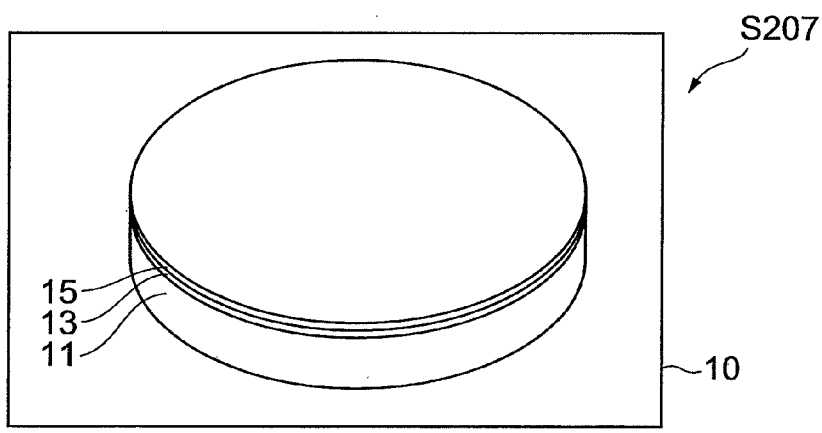
FIG. 5 is a drawing illustrating major steps of the method of forming a nitride semiconductor light-emitting device and the method of forming an epitaxial wafer in accordance with an embodiment.
Figure 5:
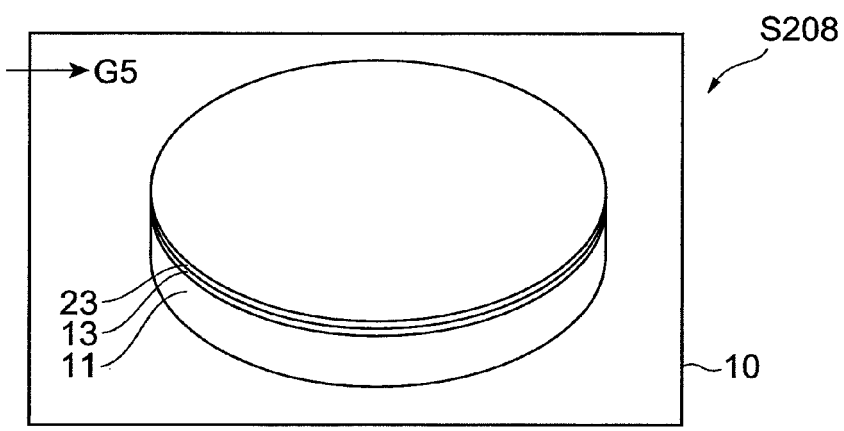
Figure 5:
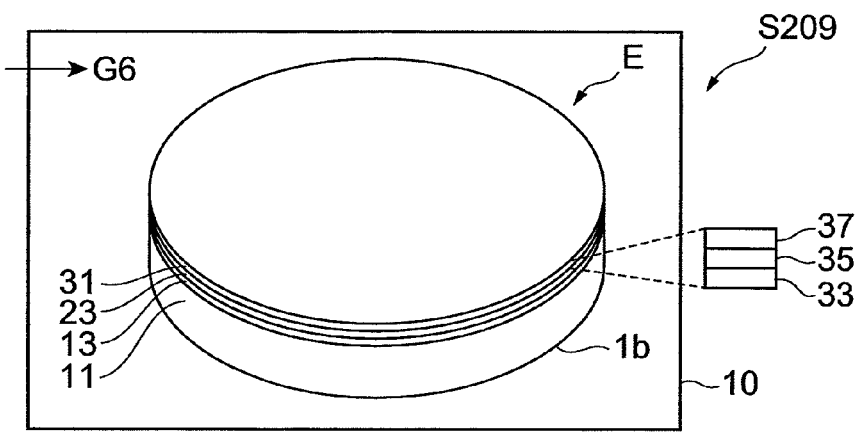

FIGS. 3 and 5 illustrate major steps of the method of forming a nitride semiconductor light-emitting device and a method of forming an epitaxial wafer in accordance with the present embodiment. As illustrated in part (a) of FIG. 3, in Step S201, a growth substrate 11 is prepared for forming the nitride semiconductor light-emitting device and the epitaxial wafer. The growth substrate 11 may comprises, for example, a hexagonal semiconductor $In_SAl_TGa_{1-S-T}N$ ($0 \leq S \leq 1$, $0 \leq T \leq 1$, $0 \leq S+T \leq 1$), such as GaN, InGaN, AlGaN, and InAlGaN. The growth substrate 11 has a primary surface 11a and a back surface 11b. Part (a) of FIG. 3 shows a vector VC2 indicating the direction of the c-axis of hexagonal semiconductor of the growth substrate 11 and a normal vector VN of the primary surface 11a, the vector VC2 indicating the orientation of the (0001) plane. The growth substrate 11 can provide a semipolar nature in which a growth primary surface has a tilt angle (off-angle) β.

The tilt angle of the primary surface 11a of the growth substrate 11 is determined with respect to the (0001) plane of the hexagonal semiconductor. In an embodiment using a GaN substrate, when the tilt angle β of the growth substrate 11 is within 40 degrees to 140 degrees, the piezoelectric polarization having a desirable sign can be obtained in this angular range of the practical orientation away from the polar surface. When the plane orientation of the growth substrate 11 is in the angular range of 40 degrees to 50 degrees or 90 degrees to 130 degrees, electrons can be supplied to the entire multiple-quantum well structure by use of a positive piezoelectric polarization. The plane orientation of the primary surface 11a may be any one of the (10-12) plane, (11-2-2) plane, (10-1-1) plane, and (20-2-1) plane. The growth substrate 11 having a plane orientation in the angular range of 100 degrees to 117 degrees provides the light-emitting layer with a good indium incorporation efficiency. The primary surface 11a of the growth substrate 11 in the angular range of 63 degrees to 80 degrees can not only reduce the leakage of electrons from the light-emitting layer by use of the negative piezoelectric polarization, but also enhance a good indium incorporation efficiency. The plane orientation of the primary surface 11a may be, for example, the (20-21) plane.

The maximum value Dia of the distance between two points on the edge of the substrate 11 may be not smaller than 45 mm. Such a substrate is called, for example, a wafer. The back surface 11b of the substrate 11 may be substantially parallel to the primary surface 11a of the substrate 11. The substrate 11 composed of GaN can permit an epitaxial growth with high crystal quality.

In the next step, a semiconductor crystal is epitaxially grown on the primary surface 11a of the substrate 11 having an off-angle selected such that the piezoelectric polarization with a negative direction is induced in the well layer. A substrate 11 having the primary surface 11a of a tilt angle (off-angle) in the range described above can provide an epitaxial semiconductor region formed such that a well layer in the active layer tilts with respect to the c-plane at an angle in the above range.

In the primary surface 11a of the substrate 11 that tilts toward the a-axis of the hexagonal semiconductor of the substrate 11, an epitaxial wafer formed on the substrate 11 can be cleaved along the m-plane. In the primary surface 11a of the substrate 11 that tilts toward the m-axis of the hexagonal semiconductor of the substrate 11, an epitaxial wafer formed on the substrate 11 can be cleaved along the a-plane. In the primary surface 11a that tilts toward the a-axis of the hexagonal semiconductor of the substrate 11, the off-angle in the m-axis direction preferably ranges from −3 degrees to +3 degrees. In the primary surface 11a that tilts toward the m-axis of the hexagonal semiconductor of the substrate 11, the off-angle in the a-axis direction preferably ranges from −3 degrees to +3 degrees. An off-angle in such an angle range can decrease a reduction in light reflection caused by a tilt of end faces of an optical cavity in the nitride semiconductor light-emitting device LD1, resulting in a low lasing threshold.

As illustrated in part (b) of FIG. 3, the substrate 11 is disposed in a growth reactor 10. In Step S202, prior to film formation, the substrate 11 is heat-treated while gas G0 is supplied into the reactor 10 to form a modified primary surface 11c. The heat treatment may be conducted in an atmosphere of ammonia and hydrogen. The heat-treatment temperature T0 may be in the range of, for example, 800 degrees Celsius to 1200 degrees Celsius. The time for the heat treatment is, for example, about 10 minutes. In this step, a surface structure different from that of the c-plane primary surface is formed in the tilting semipolar primary surface 11a. Such preliminarily heat-treatment of the primary surface 11a of the substrate 11 causes modification of the semiconductor primary surface which does not occur in c-plane primary surfaces. An epitaxial growth film of gallium nitride based semiconductor is formed on the modified primary surface 11c of the substrate 11.

As illustrated in part (c) of FIG. 3, in the Step S203, after the heat treatment, a first conductivity type gallium nitride based semiconductor region 13 is epitaxially grown on the surface 11c of the substrate 11. Metalorganic vapor phase epitaxy is employed for the growth. Source gases used for the growth are as follows: a gallium source, an indium source, an aluminum source, and a nitrogen source, and the gallium source, the indium source, the aluminum source, and the nitrogen source are, for example, TMG, TMI, TMA, and NH$_3$, respectively. For the growth, a source gas G1 is fed to the reactor 10. The primary surface 13a of the gallium nitride based semiconductor region 13 tilts substantially at a tilt angle β with respect to the c-plane of the gallium nitride semiconductor. The first conductivity type gallium nitride based semiconductor region 13 can includes at least one gallium nitride based semiconductor layer (e.g. gallium nitride based semiconductor layers 25, 27, and 29). Specifically, the gallium nitride based semiconductor layers 25, 27, and 29 are an n-type AlGaN layer, n-type GaN layer, and n-type InGaN layer, respectively. The gallium nitride based semiconductor layers 25, 27, and 29 are epitaxially grown on the primary surface 11c of the substrate 11 in sequence. An n-type AlGaN layer 25 is, for example, an intermediate layer covering the entire surface of the substrate 11, and is grown at, for example, 1100 degrees Celsius. The n-type AlGaN layer 25 has a thickness of, for example, 50 nm. The n-type GaN layer 27 is grown on the n-type AlGaN layer at 950 degrees Celsius. The n-type GaN layer 27 supplies, for example, n-type carriers, and has a thickness of 2000 nm. The n-type InGaN layer 29 is grown on the n-type GaN 27 at 840 degrees Celsius. The n-type InGaN layer 29 is, for example, a buffer layer for an active layer, and has a thickness of 100 nm.

Figure 4:
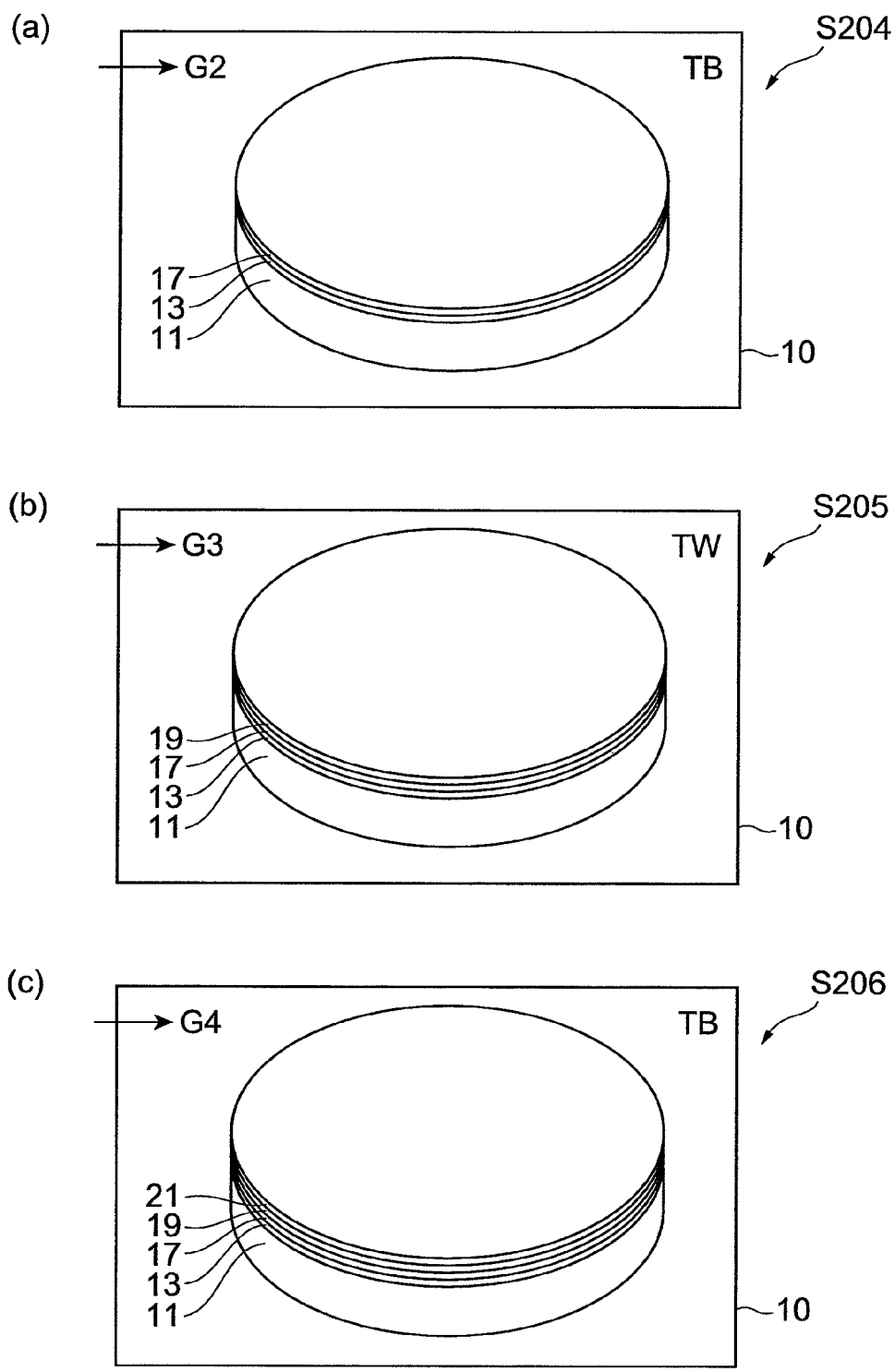
FIG. 4 is a drawing illustrating major steps of the method of forming a nitride semiconductor light-emitting device and a method of forming an epitaxial wafer in accordance with an embodiment.

In the next step, an active layer 15 of the nitride semiconductor light-emitting device is prepared according to the procedure shown in FIGS. 4 and 5. The active layer 15 is provided to generate an emission spectrum having a peak intensity in the wavelength region of 460 nm to 550 nm. In the above wavelength range, the piezoelectric polarization in the active layer can be selected to have an appropriate direction.

With reference to part (a) of FIG. 4, in Step S204, a barrier layer 17 is formed for a quantum well structure of the active layer 15, and comprises a gallium nitride based semiconductor. The barrier layer 17 is grown on the buffer layer at a growth temperature TB by feeding a source gas G2 to the reactor 10. The barrier layer 17 comprises In$_Y$Ga$_{1-Y}$N (composition of indium Y: $0 \leq Y \leq 0.05$, where Y indicates the strained composition). The barrier layer 17 is grown at a growth temperature TB of, for example, 700 degrees Celsius to 1000 degrees Celsius. In this embodiment, the undoped GaN is grown at a growth temperature T3 by feeding a source gas G2, which contains a gallium source and a nitrogen source, to the reactor 10. The GaN barrier layer has a thickness of, for example, 15 nm. Since the barrier structure 17 is grown on the primary surface 13a, the surface structure of the barrier structure 17 corresponds to the surface structure of the primary surface 13a.

After the growth of the barrier layer 17, the feed of a gallium source is stopped to terminate the growth of gallium semiconductor. After the growth of the barrier layer 17 and before the growth of a well layer, the temperature of the reactor is changed from the growth temperature TB to a growth temperature TW while a nitrogen source gas such as ammonia is fed to the reactor 10.

With reference to part (b) of FIG. 4, in Step S205, a well layer 19 for a quantum well structure is grown on the barrier layer 17 while the temperature of the reactor 10 is maintained at the well layer growth temperature TW. The well layer 19 comprises an indium-containing gallium nitride based semiconductor such as $In_XGa_{1-X}N$ (composition of indium X: $0 \leq X \leq 1$, where X indicates strained composition). The well layer 19 has a band gap energy level smaller than that of the bather layer 17. The growth temperature TW of the well layer 19 may be equal to or lower than the growth temperature TB. In this embodiment, the undoped InGaN is grown at a growth temperature TB by feeding a source gas G3, which contains a gallium source, an indium source, and a nitrogen source, into the reactor 10. The well layer 19 may have a thickness of 1 nm to 10 nm. The composition of indium X of the $In_XGa_{1-X}N$ well layer 19 may be greater than 0.10. The composition of indium X of the well layer 19 may be smaller than 0.5. Thus, InGaN having a composition of indium within this range can be grown, thereby fabricating a light-emitting device having an emission wavelength in a range of 440 nm to 550 nm. The well layer 19 is grown at a growth temperature TW in the range of, for example, 600 degrees Celsius to 900 degrees Celsius. The InGaN well layer has a thickness of, for example, 3 nm. The primary surface of the well layer 19 has a structure inheriting the surface structure of the barrier layer 17, because the primary surface of the well layer 19 is epitaxially grown on the primary surface of the barrier layer 17. The primary surface of the well layer 19 tilts at a predetermined angle, corresponding to the tilt angle of the primary surface of the barrier layer 17, with respect to the c-plane of the gallium nitride based semiconductor.

After the growth of the well layer 19 and before the growth of a barrier layer, the temperature of the reactor 10 is changed from the growth temperature TW to a growth temperature TB, while a nitrogen source gas such as ammonia is fed to the reactor 10. With reference to part (c) of FIG. 4, after the completion of temperature rise in the reactor 10, in Step S206, a barrier layer 21 of a gallium nitride based semiconductor is grown while a source gas G4 is fed to the reactor 10 at the temperature TB. In the present embodiment, the barrier layer 21 is made of, for example, GaN having a thickness of 15 nm. The primary surface of the barrier layer 21, which is epitaxially grown on the primary surface of the well layer 19, inherits the surface structure of the well layer 19. The well layer 19 has internal strain caused by stress of the barrier layer 21, and this strain is, for example, compressive. The active layer 15 may include a well layer 19, and barrier layers 17 and 21, which are alternately arranged. The active layer 15 may have a single quantum well structure or a multiple-quantum well structure, or comprise a bulk semiconductor layer.

Through repeated growth in Step S207, the active layer 15 having a quantum well structure is grown, as illustrated in part (a) of FIG. 5. The active layer 15 includes three well layers 19 and four barrier layers 17 and 21. With reference to part (b) of FIG. 5, in Step S208, necessary semiconductor layers such as a light-emitting layer 23 are grown by feeding a source gas G5. The band gap of the semiconductor layer in the light-emitting layer 23 between the active layer 15 and the second conductivity type gallium nitride based semiconductor region 31 is smaller than that of a gallium nitride based semiconductor layer, which is adjacent to the light-emitting layer 23, in the second conductivity type gallium nitride based semiconductor region 31.

With reference to part (c) of FIG. 5, in the Step S209, the second conductivity type gallium nitride based semiconductor region 31 is epitaxially grown on the light-emitting layer 23 by feeding a source gas G6. This growth is carried out in the reactor 10. The second conductivity type gallium nitride based semiconductor region 31 includes, for example, an electron-blocking layer 33, a p-type cladding layer 35, and a p-type contact layer 37. The electron-blocking layer, for example, comprises AlGaN. The p-type cladding layer comprises p-type GaN, AlGaN, or InAlGaN. The p-type contact layer 37 comprises p-type GaN. In the present example, the growth temperature of the electron blocking layer 33, p-type cladding layer 35, and p-type contact layer 37 is, for example, 1100 degrees Celsius. After the formation of the second conductivity type gallium nitride based semiconductor region 31, an epitaxial wafer E shown in part (c) of FIG. 5 is completed. A pair of optical guide layers for guiding light in a semiconductor laser may be grown, if necessary. The pair of optical guide layers sandwiches the active layer. The optical guide layers may comprise, for example, InGaN or GaN.

In the epitaxial wafer E, the first conductivity type gallium nitride based semiconductor region 13, the light-emitting layer 23, and the second conductivity type gallium nitride based semiconductor region 31 may be arranged along the axis normal to the primary surface 11a of the substrate 11. The direction of the c-axis of the hexagonal semiconductor of the substrate 11 is different from that of the normal axis of the primary surface 11a of the substrate 11.

In the next step, electrodes are formed on the epitaxial wager E. A first electrode (e.g. an anode electrode) is formed on the contact layer described above, while a second electrode (e.g. a cathode electrode) is formed on the back surface 11b of the substrate.

After the formation of the electrodes, a laser bar can be formed accompanied by processing for formation of end faces for an optical cavity. The processing for formation of end faces for the optical cavity enables the formation of a semiconductor laser having end surfaces that are formed through, for example, cleavage or dry etching. If the primary surface 11a of the substrate 11 tilts in the direction of the a-axis (m-axis) of the gallium nitride based semiconductor, the m-plane (a-plane) can be used as a cleavage plane.

The plane orientations and angular range used for the formation of the light-emitting device described above are determined as follows. The procedure for selecting an appropriate direction of the piezoelectric polarization in an active layer is explained.

In Step S101, at least one tilt angle for the primary surface, comprising a group III nitride semiconductor, of a substrate is selected to estimate the direction of piezoelectric polarization in a light-emitting layer.

In Step S102, a substrate is prepared, and the substrate provides the primary surface that has the selected tilt angle. The primary surface comprises a group III nitride semiconductor.

In Step S103, growth of p- and n-type gallium nitride semiconductor layers and a quantum well structure for the light-emitting layer are grown at the selected tilt angle to prepare a substrate product. Apparatuses and processes used for the formation of the light-emitting devices described above may be applied to the formation of the substrate product.

Figure 6:
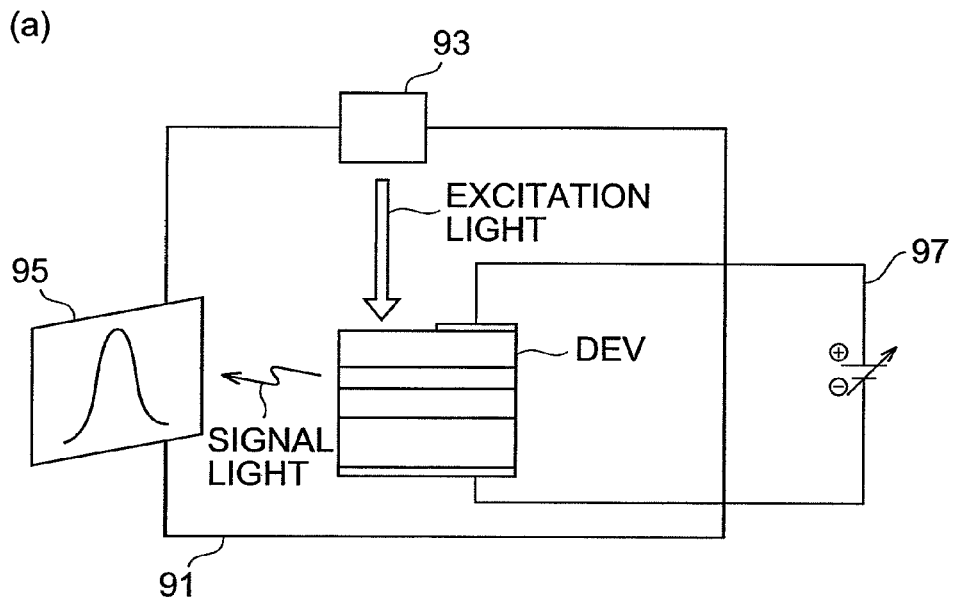
FIG. 6 is a drawing illustrating the measurement of the dependence of photoluminescence (PL) on bias.
Figure 6:
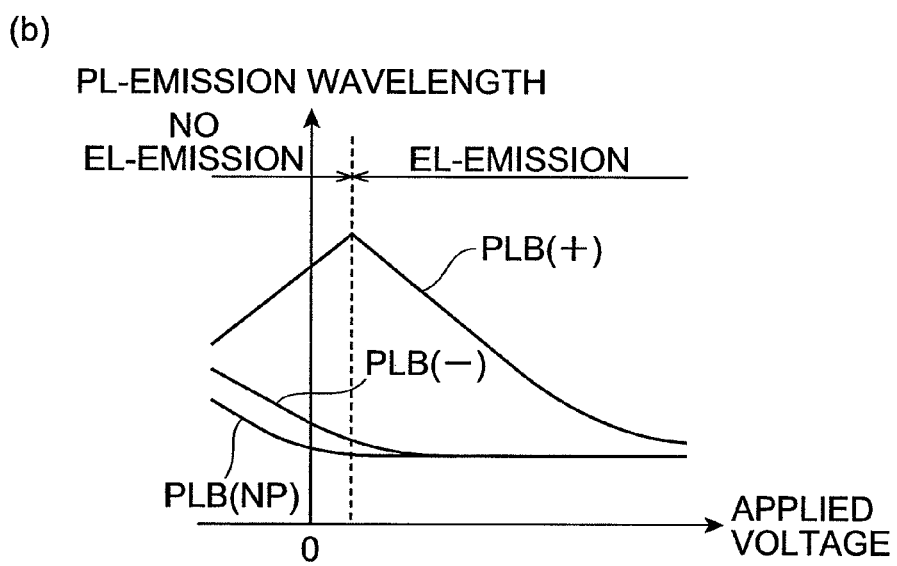

In Step S104, the measurement of photoluminescence of the substrate product is carried out while an electrical bias is applied to the substrate product in order to determine dependence of the photoluminescence of the substrate product on the bias. Specifically, in Step S104, a PL (photoluminescence)-measuring device is prepared and enables the measurement of PL spectrum in the application of voltage bias to the fabricated device. Part (a) of FIG. 6 illustrates an exemplary structure of the PL-measuring device. The PL-measuring device includes an optical excitation source 93 for radiating excitation light to a device DEV, a PL-detecting device 95 for detecting photoluminescence from the device DEV, and a device 97 for applying a variable bias electrical to the device DEV. The bias dependence of the photoluminescence is measured while a variable bias is applied to the substrate product. The results of the bias dependence are shown by characteristic lines on the graph shown in part (b) of FIG. 6. If forward bias voltage exceeding a threshold voltage is applied, the device DEV emits electroluminescence. A forward or reverse low bias voltage does not cause electroluminescence.

A device fabricated on a semipolar surface having a certain range of an off-angle or on the c-plane of a GaN wafer generates positive piezoelectric polarization in the light-emitting layer. The characteristics of this device is represented by the characteristic line PLB(+) in part (b) of FIG. 6. The peak wavelength of the PL emission shifts to a longer wavelength region as the bias voltage increases in the bias ranges below the EL emission voltage, whereas, over the EL emission voltage, shifts to a shorter wavelength region as the bias voltage increases.

The device fabricated on the non-polar surface of the GaN wafer generates no piezoelectric polarization in the light-emitting layer. The characteristics of this device is represented by the characteristic line PLB(NP) in part (b) of FIG. 6. The peak wavelength of the PL emission shifts slightly to a shorter wavelength region as the bias voltage increases in the bias range below the zero bias voltage. Positive bias does not cause any substantial shift of the peak wavelength.

A device fabricated on a semipolar surface having off-angle in a specific range according to an embodiment of the present invention generates negative piezoelectric polarization in the light-emitting layer. The characteristics of this device is represented by the characteristic line PLB(−) in part (b) of FIG. 6. The peak wavelength of the PL emission shifts slightly to a shorter wavelength region as the bias voltage increases in a bias range below the EL emission voltage.

In Step S105, the estimation of the direction of the piezoelectric polarization in the light-emitting layer at each of the selected tilt angle for the primary surface of each substrate is carried out by the observed bias dependence. The direction of the piezoelectric polarization is determined by the measurement results in part (b) of FIG. 6.

In Step S106, the angular ranges containing plural tilt angles is divided into segments depending on the positive or negative sign of piezoelectric polarization based on the estimation of the direction of the piezoelectric polarization. The determination is carried out for based on the above segmentation. The estimation of the direction of piezoelectric polarization determines the positive or negative sign of piezoelectric polarization. The angular ranges are categorized into angular sub-ranges of positive polarization and/or angular sub-ranges of negative polarization depending on the sign of piezoelectric polarization. When the substrate product is fabricated using a group III nitride substrate, the sign of piezoelectric polarization associated with the relation between the group III nitride substrate and the light-emitting layer can be determined.

In Step S107, the use of a tilt angle on the primary surface or the back surface of the substrate is determined based on the estimation to select the plane orientation of the growth substrate 11 for fabricating the semiconductor light-emitting device.

For example, the primary surface 11a of the growth substrate 11 can be selected such that the piezoelectric polarization in the well layer has a direction from the n-type nitride semiconductor layer to the p-type nitride semiconductor layer (piezoelectric polarization in the positive direction). This selection can provide the well layer with desired piezoelectric polarization by adjusting a tilt angle on the primary surface of the substrate or a tilt angle on the back surface opposite to the primary surface of the substrate by use of the estimation of the direction of the piezoelectric polarization.

In Step S108, if the estimation demonstrates that the piezoelectric polarization has a positive direction from the n-type group III nitride semiconductor layer to the p-type group III nitride semiconductor layer in a part or whole of an angle range containing the tilt angles, a substrate is prepared as a growth substrate and has a primary surface providing a tilt angle exhibiting the positive direction of the piezoelectric polarization. If the desired piezoelectric polarization lies in the positive direction, the growth substrate to be prepared has a primary surface providing a tilt angle exhibiting a positive piezoelectric polarization.

In Step S109, if the estimation demonstrates that the piezoelectric polarization has a negative direction from the p-type group III nitride semiconductor layer to the n-type group III nitride semiconductor layer in a part or whole of an angle range containing the tilt angles, a substrate is prepared as a growth substrate and has a primary surface that provides a back side opposite to the plane orientation of a tilt angle exhibiting the piezoelectric polarization in the negative direction. If the desired piezoelectric polarization lies in the positive direction, the growth substrate to be prepared has a primary surface providing a plane orientation opposite to the plane orientation of a tilt angle exhibiting a negative piezoelectric polarization.

For example, the primary surface 11a of the growth substrate 11 can be selected such that the piezoelectric polarization in the well layer has a direction from the p-type nitride semiconductor layer to the n-type nitride semiconductor layer (piezoelectric polarization in the negative direction). This selection can provide the well layer with desired piezoelectric polarization by adjusting a tilt angle on the primary surface of the substrate or a tilt angle on the back surface opposite to the primary surface of the substrate by use of the estimation of the direction of the piezoelectric polarization.

In Step S110, if the evaluation demonstrates that the piezoelectric polarization has the positive direction from the n-type group III nitride semiconductor layer to the p-type group III nitride semiconductor layer in a part or whole of an angle range containing the tilt angles, a substrate is prepared as a growth substrate 11 and has a primary surface that provides a back side opposite to the plane orientation of a tilt angle exhibiting piezoelectric polarization in the positive direction. The growth substrate to be prepared has a primary surface that provides a plane orientation opposite to the plane orientation of a tilt angle exhibiting positive piezoelectric polarization if the desired piezoelectric polarization is oriented in the negative direction.

In Step S111, if the evaluation demonstrates that the piezoelectric polarization is oriented in the negative direction from the p-type group III nitride semiconductor layer to the n-type group III nitride semiconductor layer in a part or whole of an angle range containing the tilt angles, a substrate is prepared as a growth substrate 11 and has a primary surface that provides a tilt angle exhibiting piezoelectric polarization in the negative direction. If the desired piezoelectric polarization is oriented in the negative direction, the growth substrate to be prepared has a primary surface that provides a tilt angle exhibiting negative piezoelectric polarization.

In Step S112, a semiconductor laminate for a semiconductor light-emitting device is formed on the primary surface 11a of the growth substrate 11.

EXAMPLE 1

Figure 7:
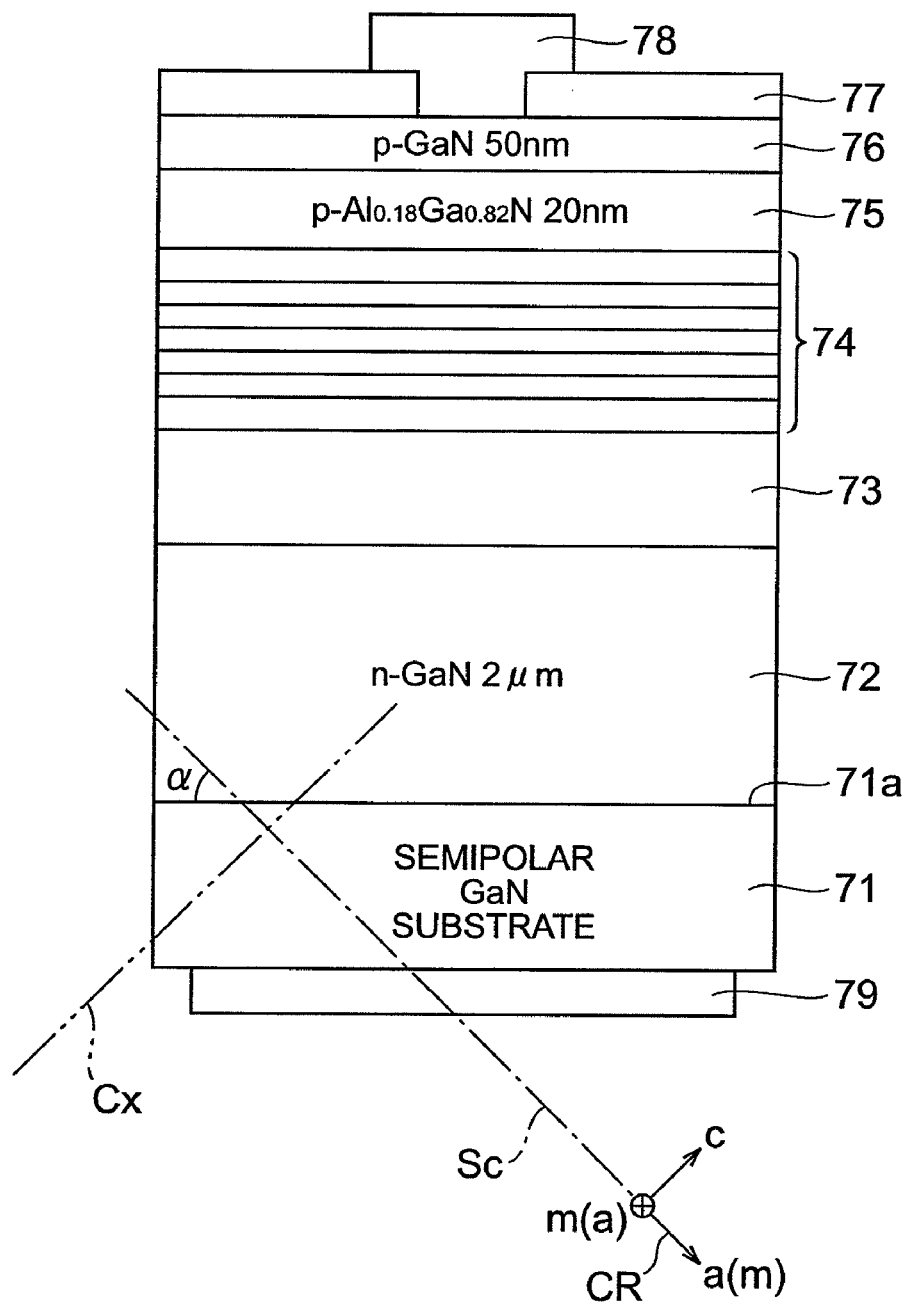
FIG. 7 is a drawing illustrating an LED structure of Devices 1 to 9.

Devices 1 to 9 including light-emitting diodes (LEDs) are prepared. FIG. 7 illustrates the LED structure of Devices 1 to 9. Device 2 and Device 6 are formed on a polar surface and a non-polar surface, respectively. GaN substrates 71 having plane orientations corresponding to Devices 1 to 9 are prepared for the LED structure shown in FIG. 7. The primary surface 71a of each GaN substrate 71 had a plane orientation and an off-angle listed in FIG. 8. The off-angle $\alpha$ is defined by the reference plane Sc perpendicular to the reference axis Cx extending along the c-axis, and the primary surface. The GaN substrate 71 is loaded into a reactor, and ammonia ($NH_3$) and hydrogen ($H_2$) are supplied to the reactor. The GaN substrate 71 is kept at temperature of 1050 degrees Celsius for 10 minutes. After this pretreatment (thermal cleaning), source gases are fed to fabricate an epitaxial laminate structure by metalorganic vapor phase epitaxy, as described below.

An n-type GaN layer 72 having a thickness of 2 μm is grown at a temperature of 1100 degrees Celsius. An n-type InGaN strain relief layer 73 having a thickness of 100 nm is grown at a temperature of 800 degrees Celsius. The buffering layer 73 has a composition of indium of 0.02. Subsequently, a light-emitting layer 74 is grown thereon. The light-emitting layer 74 had a multiple quantum well structure, which includes barrier layers of GaN having a thickness of 15 nm and well layers of InGaN having a thickness of 3 nm arranged alternately. The incorporation efficiency of indium in the well layer differs depending on the off-angle of the GaN substrate 71. Accordingly, the growth temperatures of the well layers and the barrier layers are adjusted such that the well layers may have a desired composition and a desired emission wavelength. Growth of the well layers and the barrier layers is repeated until three well layers have been grown. Subsequently, a p-type AlGaN electron-blocking layer 75 having a thickness of 20 nm is grown over the light-emitting layer 74 at a temperature of 1000 degrees Celsius. The electron-blocking layer 75 has a composition of aluminum of 0.18. Then, a p-type GaN contact layer 76 having a thickness of 50 nm is grown on the electron block layer 75 at a temperature of 1000 degrees Celsius. An anode 77 of Ni/Au is formed on the p-type GaN contact layer 76, and a cathode 79 of Ti/Al is formed on the back surface of the GaN substrate 71. A pad electrode 78 of Ti/Au is formed on the anode 77.

FIG. 8 shows the plain orientations, off-angles $\alpha$ of the primary surfaces and emission wavelength of Devices 1 to 9. As shown in FIG. 8, the plain orientations of Devices 1 to 9 are (10-12), (0001), (11-22), (10-11), (20-21), (10-10), (20-2-1), (20-21) and (20-2-1), respectively. The off-angles of Devices 1 to 9 in the direction of the m-axis or the a-axis are as follows: 43 degrees (the m-axis direction); 0 degrees; 58 degrees (the a-axis direction); 62 degrees (the m-axis direction); 75 degrees (the m-axis direction); 90 degrees (the m-axis direction); 105 degrees (the m-axis direction); 75 degrees (the m-axis direction); and 105 degrees (the m-axis direction). The emission wavelength values of the Devices 1 to 9 are in a wavelength range of about 500 nm or about 400 nm.

Subsequently, the LEDs of Devices 1 to 9 are irradiated with excitation light from above the anode electrode 77 to measure the bias dependence of the PL (photoluminescence) while a bias is applied thereto to determine the direction of piezoelectric polarization in the well layer. Changes in band diagram obtained by the application of bias are explained with reference to FIGS. 9 and 10.

Figure 9:
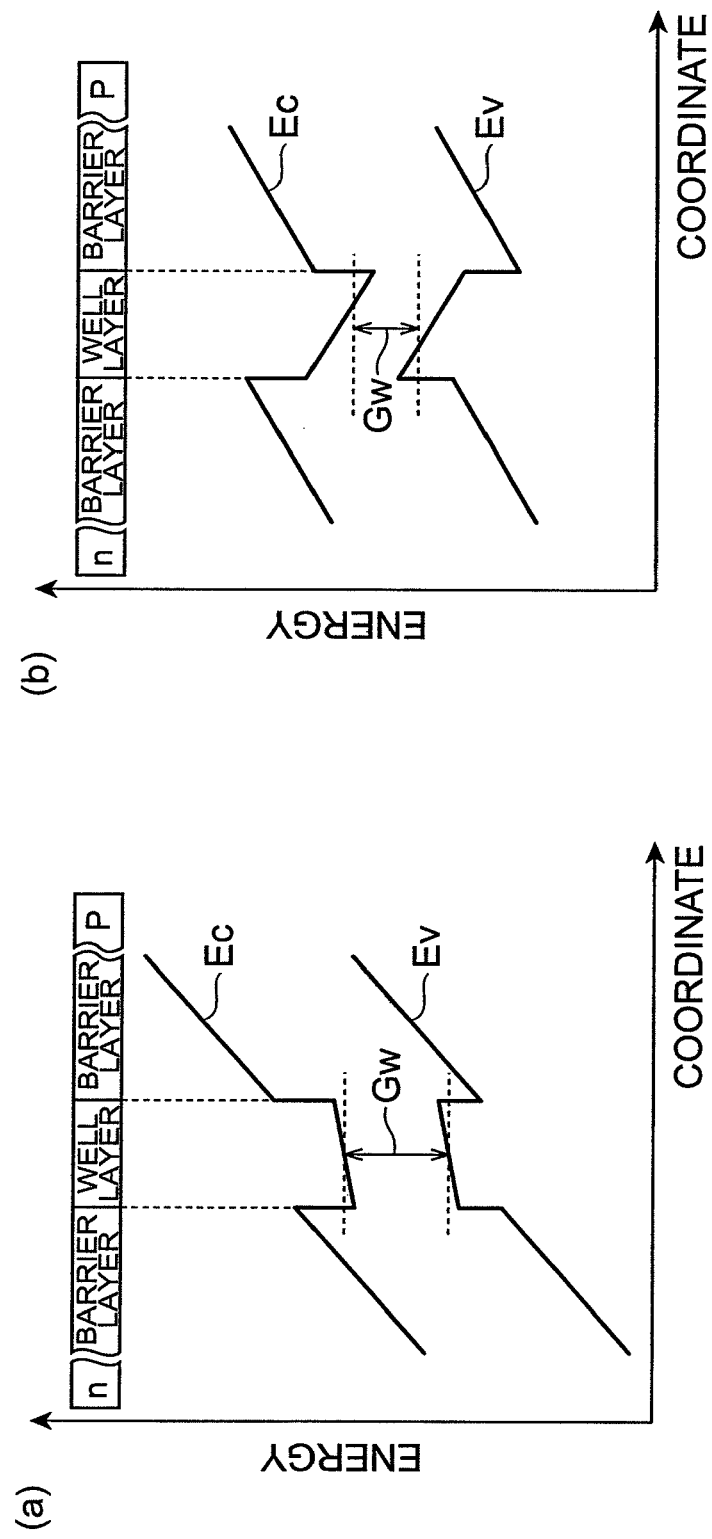
FIG. 9 is a drawing illustrating a change in band diagram by bias application during PL measurement.
Figure 10:
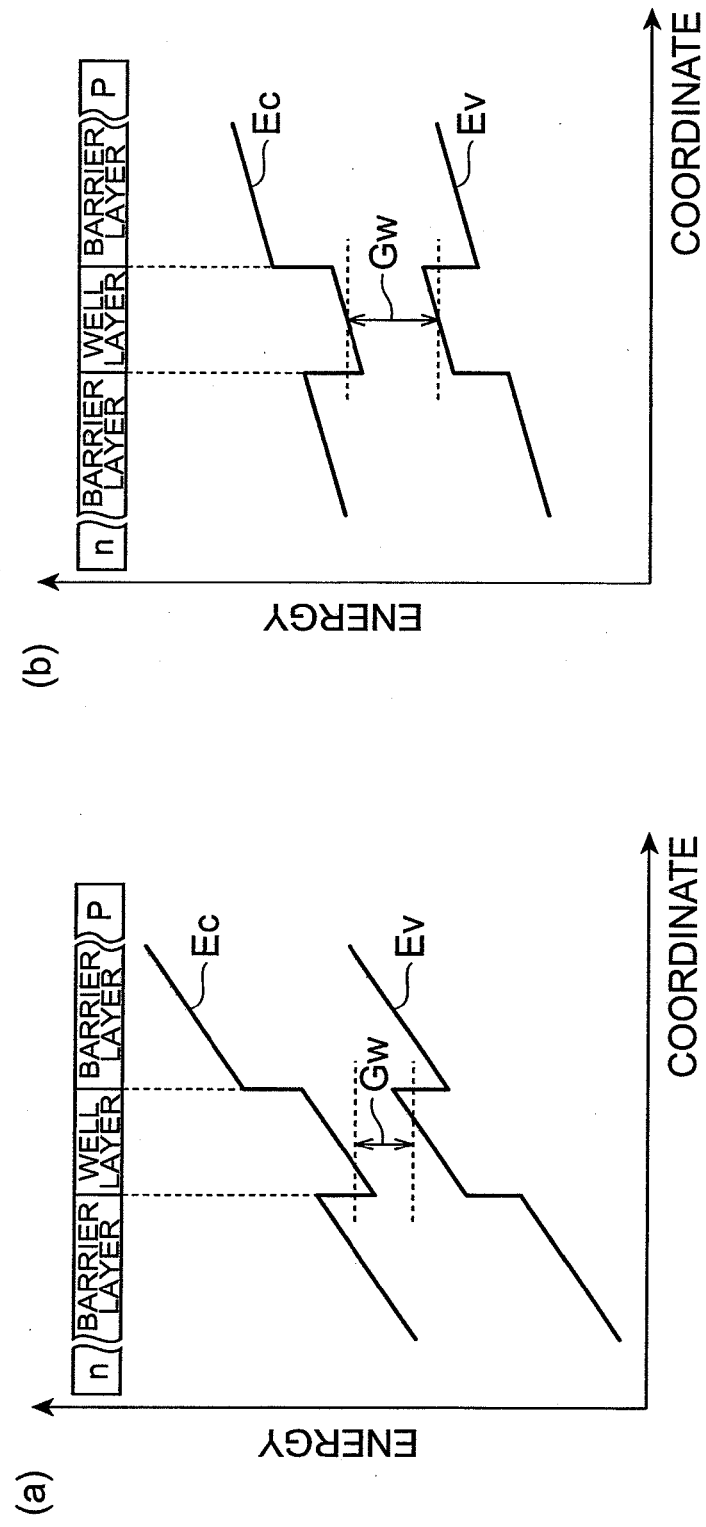
FIG. 10 is a drawing illustrating a change in band diagram by bias application during PL measurement.

FIGS. 9 and 10 illustrate the band diagrams in the well layer and barrier layer. FIG. 9 shows an energy band of a well layer exhibiting strong positive piezoelectric polarization, while FIG. 10 represents an energy band of a well layer exhibiting weak positive piezoelectric polarization or negative piezoelectric polarization. The positive direction of the horizontal lines in these drawings agrees with the direction from the n-type nitride semiconductor layer to the p-type nitride semiconductor layer. Parts (a) of FIGS. 9 and 10 show the band diagrams in a light-emitting layer which is not biased, while parts (b) of FIGS. 9 and 10 show the band diagrams in a light-emitting layer to which forwardly bias is applied.

As shown in FIG. 9, in a well layer exhibiting strong positive piezoelectric polarization, forward bias application changes the directions of the tilts of the conduction band Ec and the valence band By of the well layer. Thus, the application of forward bias reduces the energy gap Gw between the lowest energy level of the conduction band Ec and the highest energy level of the valence band By in the well layer. This results in that the application of forward bias causes the bias dependence of the PL wavelength to exhibit a red shift.

In contrast, as shown in FIG. 10, in a well layer exhibiting significantly small piezoelectric polarization or negative piezoelectric polarization, the application of forward bias does not change the directions but reduce the magnitudes of the tilts of the conduction band Ec and the valence band By in the well layer. Thus, the application of forward bias expands the energy gap Gw between the lowest energy level of the conduction band Ec and the highest energy level of the valence band By in the well layer. This results in that the application of forward bias causes the bias dependence of the PL wavelength to exhibit a blue shift. Bias dependences of PL/EL spectra for Devices 1 to 9 are measured at an absolute temperature of 100 K.

Figure 11:
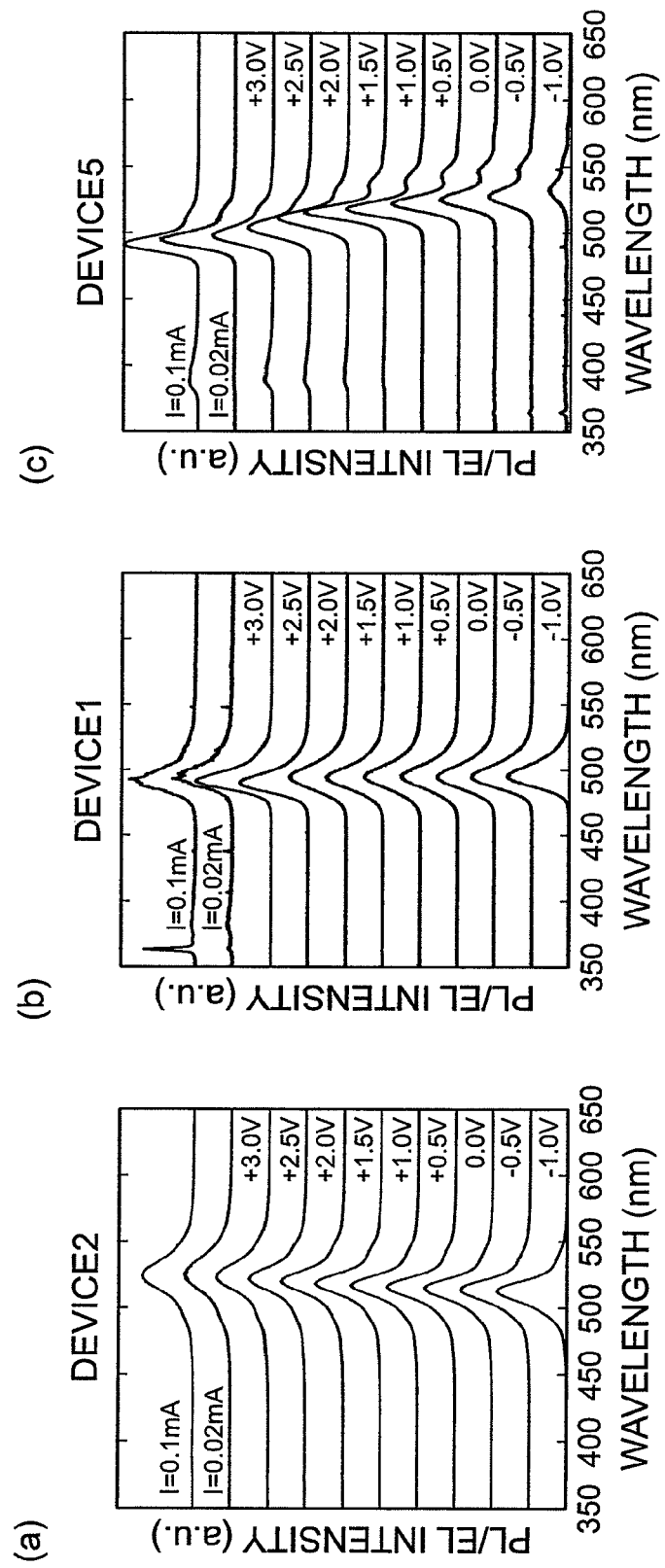
FIG. 11 is a drawing showing measured results of the dependences of typical PL spectra on bias.

Parts (a), (b) and (c) of FIG. 11 show the measured results of the bias-dependences of typical PL/EL spectra of Devices 2, 1, and 5, respectively. In FIG. 11, the horizontal axes indicate the wavelength of the spectrum peak (e.g., PL spectrum), and the vertical axes indicate the normalized PL intensity and EL intensity. The application in the range of a negative to slightly positive bias value (including zero) does not generate any electroluminescence. In this range of voltage, the PL peak wavelength in Device 2 exhibits a red shift, while the PL peak wavelength in Device 1 does not significantly change. The results indicate that the sign of the piezoelectric polarization of the well layers in Devices 2 and 1 is positive. In such a voltage range, the PL peak wavelength in Device 5 exhibits a blue shift, which indicates that the sign of the piezoelectric polarization of the well layer in Device 5 is negative.

Figure 12:
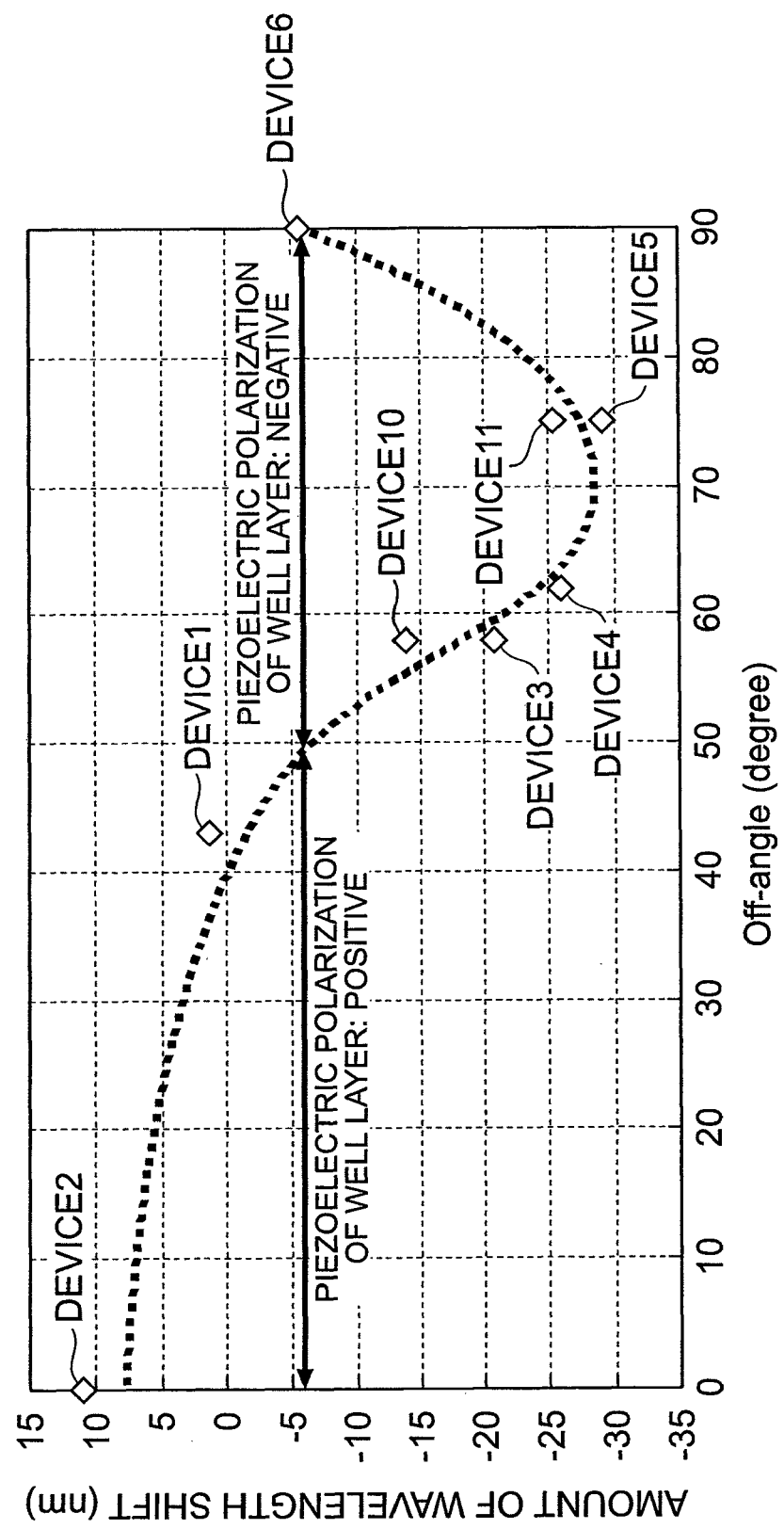
FIG. 12 is a drawing showing a relation between the amount of shift of the PL peak wavelength and the off-angle.

FIG. 12 shows a relation between the off-angle and the amount of shift of the PL peak wavelength. The dependence of the amount of the shift in the wavelength on the off-angle of the primary surface of the substrate is evaluated from the results of the biased PL measured in Devices 1 to 9. The amount of the shift in the wavelength is defined by the difference between the PL peak wavelength measured in an unbiased or zero-voltage biased condition and that measured in a bias just after the start of the EL emission. In FIG. 12, since the primary surface of Device 6 (plane orientation: (10-10), and off-angle: 90 degrees (m-axis direction)) is the m-plane, no internal electric field is generated in the well layer in Device 6. Accordingly, as is understood from the results shown in FIG. 12, devices having an amount of the shift in the wavelength greater than that of Device 6 have positive piezoelectric polarization, while devices having an amount of the shift in the wavelength smaller than that of Device 6 have negative piezoelectric polarization. FIG. 12 shows that Devices 1 and 2 have piezoelectric polarization in the positive direction, while Devices 3 to 5 have piezoelectric polarization in the negative direction. FIG. 12 shows the plot of the amount of the shift in the wavelength of PL peak wavelength of Devices 10 and 11. Devices 10 and 11 are fabricated in the same manner as Devices 3 and 5, respectively.

In one selection of the plane orientation of the substrate, one or more angles indicating one or more plane orientations may be selected. The direction of the piezoelectric polarization of a single plane orientation allows the evaluation of the angle corresponding to the plane orientation and the sign of the piezoelectric polarization at and around this angle. In another selection of the plane orientation of the substrate, two or more angles indicating plane orientations can be selected. The directions of the piezoelectric polarization at these angles allow the evaluation of the sign of the piezoelectric polarization in the angle range between the two angles. Furthermore, in selection of the plane orientation of the substrate, three or more angles indicating plane orientations can be selected. The directions of the piezoelectric polarization at these angles allow the evaluation of the sign of the piezoelectric polarization in the angle ranges between every two adjacent angles. For example, positive polarization at one angular range and negative polarization at the other angular range; positive polarization at both angular ranges; and negative polarization at both angular ranges.

The angular range can be categorized according to the positive or negative sign of the piezoelectric polarization obtained from all or part of the results of the estimation of the direction of the piezoelectric polarization for Devices 1 to 6 shown in FIG. 12. The determination of selection of substrates is carried out based on the categorization.

The categorization of the angular range shows that, for example, the well layers of Devices 3 to 5 exhibit negative piezoelectric polarization. In order to obtain the effect that the negative piezoelectric polarization exerts, a primary surface of the substrate having an angular range corresponding to the plane orientation of each of Devices 3 to 5 is used. In contrast, in order to obtain the effect that the positive piezoelectric polarization exerts, a back surface of the substrate that has the primary surface corresponding to the plane orientations of Devices 3 to 5 is used.

The categorization of the angular range shows that, for example, the well layers of Device 1 exhibit positive piezoelectric polarization. In order to obtain the effect that the positive piezoelectric polarization exerts, a primary surface of the substrate having an angle of the plane orientation at or around the angle corresponding to the plane orientation of Device 1 is used. In contrast, in order to obtain the effect that the negative piezoelectric polarization exerts, a back surface of the substrate that has an angle of the plane orientation at or around the angle corresponding to the plane orientation of Device 1 is used. When the primary surface and the back surface of GaN substrates are properly used to fabricate similar LEDs, a desired sign of piezoelectric polarization of the well layer can be obtained. Accordingly, when the GaN substrates having a primary surface of the (11-2-2) plane (corresponding to the back surface of the GaN substrate of Device 3), (10-1-1) plane (corresponding to the back surface of the GaN substrate of Device 4), and (20-2-1) plane (corresponding to the back surface of the GaN substrate of Device 5, the primary surface of the GaN substrate of Device 7) are used to fabricate similar LEDs, the sign of piezoelectric polarization of the well layer can be designed to be positive.

Figure 13:
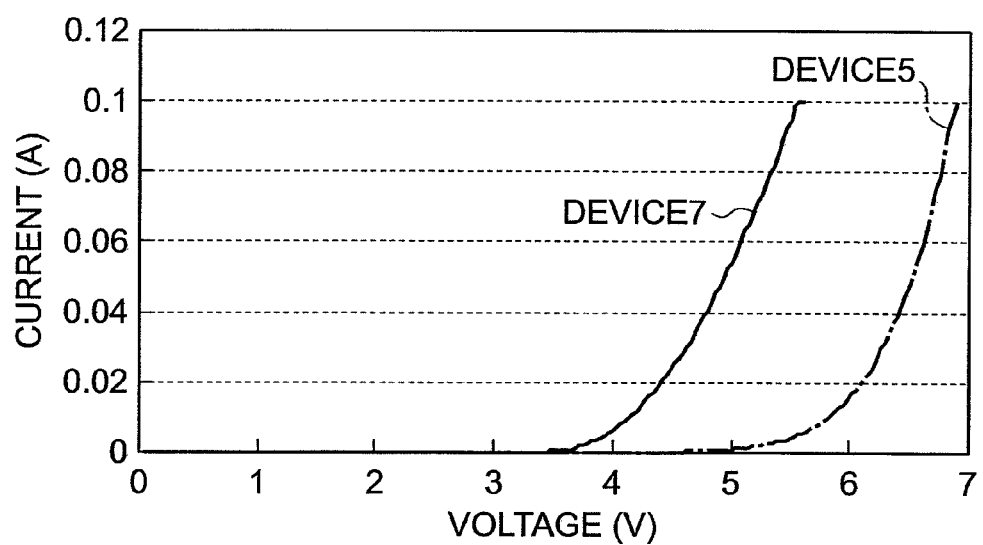
FIG. 13 is a drawing showing measured results of the voltage-current characteristics of Devices 7 and 5.

One of the technical contributions provided by use of the well layer having positive piezoelectric polarization is a reduction in a drive voltage of the light-emitting device. The voltage-current characteristics of Device 7 are compared with those of Device 5. The back surface of the GaN substrate of Device 5 corresponds to the primary surface of the GaN substrate of Device 7. As described above, the direction of the piezoelectric polarization of the well layer in Device 7 is positive whereas the direction of the piezoelectric polarization of the well layer in Device 5 is negative. FIG. 13 shows the measured results of the voltage-current characteristics of Devices 7 and 5. Referring to FIG. 13, the drive voltage of Device 7 is lower than that of Device 5, which indicates that using the positive piezoelectric polarization of the well layer can reduce the drive voltage.

Figure 14:
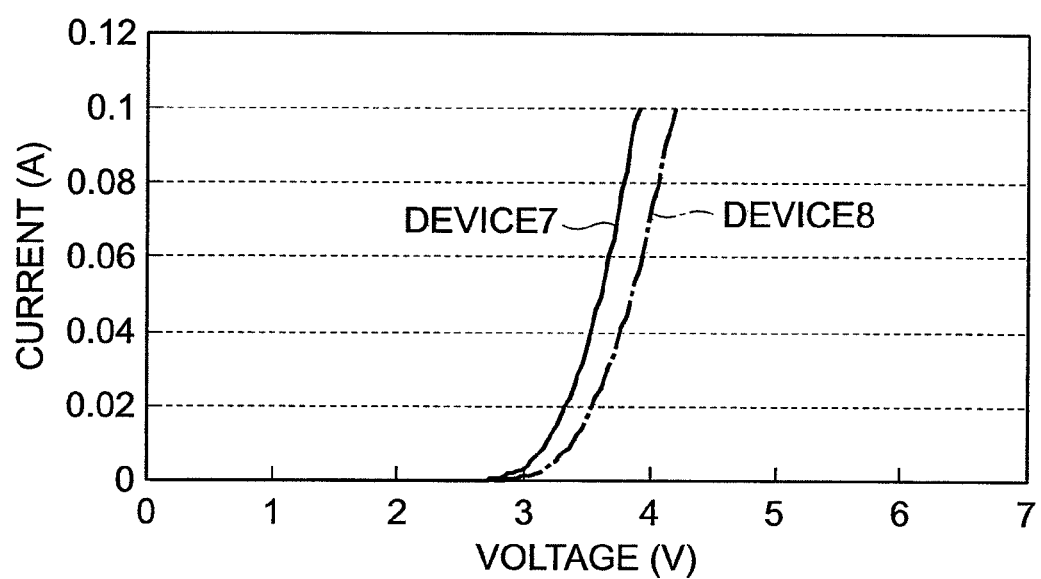
FIG. 14 is a drawing showing measured results of the voltage-current characteristics of Devices 9 and 8.
Figure 15:
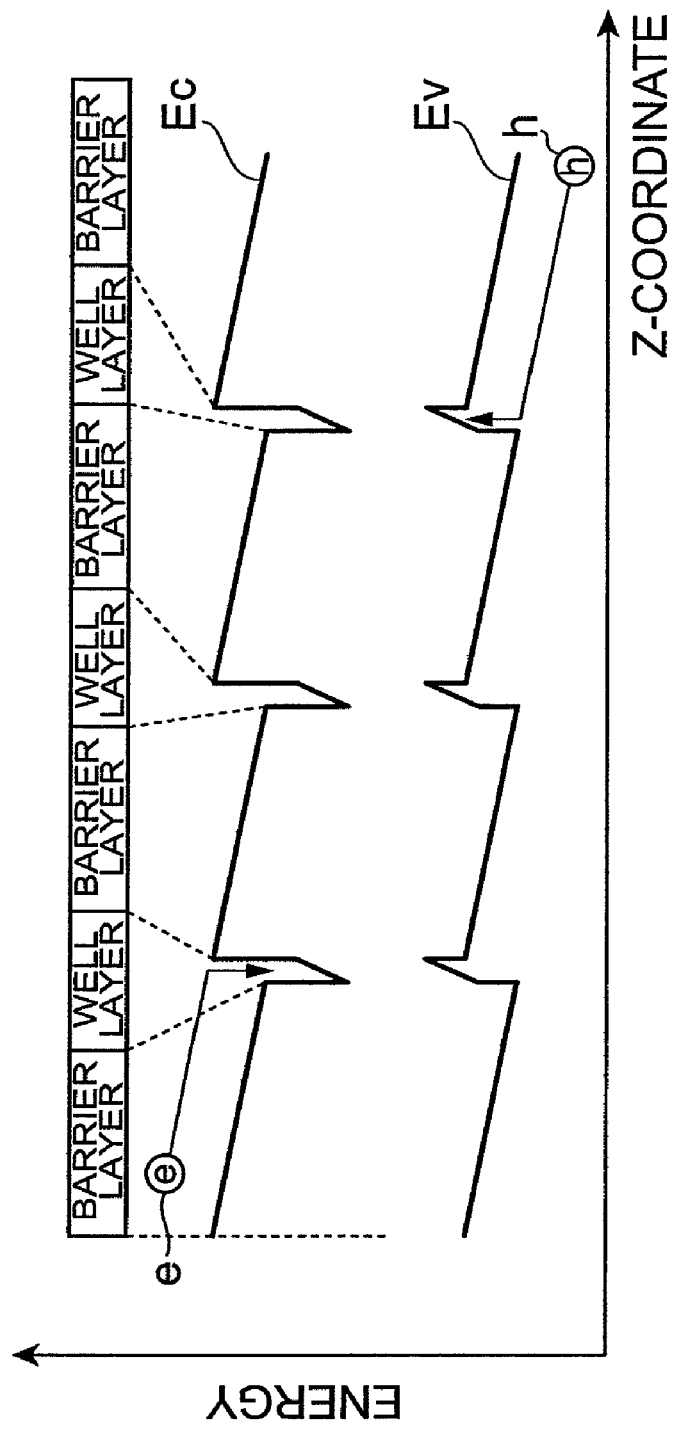
FIG. 15 is a drawing illustrating energy bands of a light-emitting layer.

In comparison of the voltage-current characteristics of Device 9 with those of Device 8, the back surface of the GaN substrate of Device 8 corresponds to the primary surface of the GaN surface of Device 9. Thus, the direction of the piezoelectric polarization of the well layer of Device 9 is positive, whereas the direction of the piezoelectric polarization of the well layer of Device 8 is negative. FIG. 14 shows the measured results of the voltage-current characteristics of Devices 9 and 8. Referring to FIG. 14, the drive voltage of Device 9 is lower than that of Device 8, which indicates that using the positive piezoelectric polarization of the well layer can reduce the drive voltage. The voltage reduction in the drive voltage of the light-emitting diode in the 400 nm wavelength band shown in FIG. 14 is smaller than that of the light-emitting diode in the 500 nm wavelength band shown in FIG. 13. The reason why a reduction in the drive voltage of the light-emitting diode in the 400 nm wavelength band is made small is as follows: the conduction band of the well layers in Devices 8 and 9 has shallow potential and this shallow potential comparatively allows electrons to easily move from one well layer to the adjacent well layer even in Device 8 having a well layer of negative piezoelectric polarization. Accordingly, the positive piezoelectric polarization may reduce the drive voltage more effectively and the deeper potential of the conduction band of the well layer may significantly enhance the reduction of the drive voltage. The depth of the well layer is estimated to be more than 0.7 eV. When the direction of the well layer is positive, a light-emitting layer including a barrier layer and a well layer and having a band gap difference of at least 0.7 eV can supply electrons to the entire multiple-quantum well structure as shown in FIG. 15.

Figure 16:
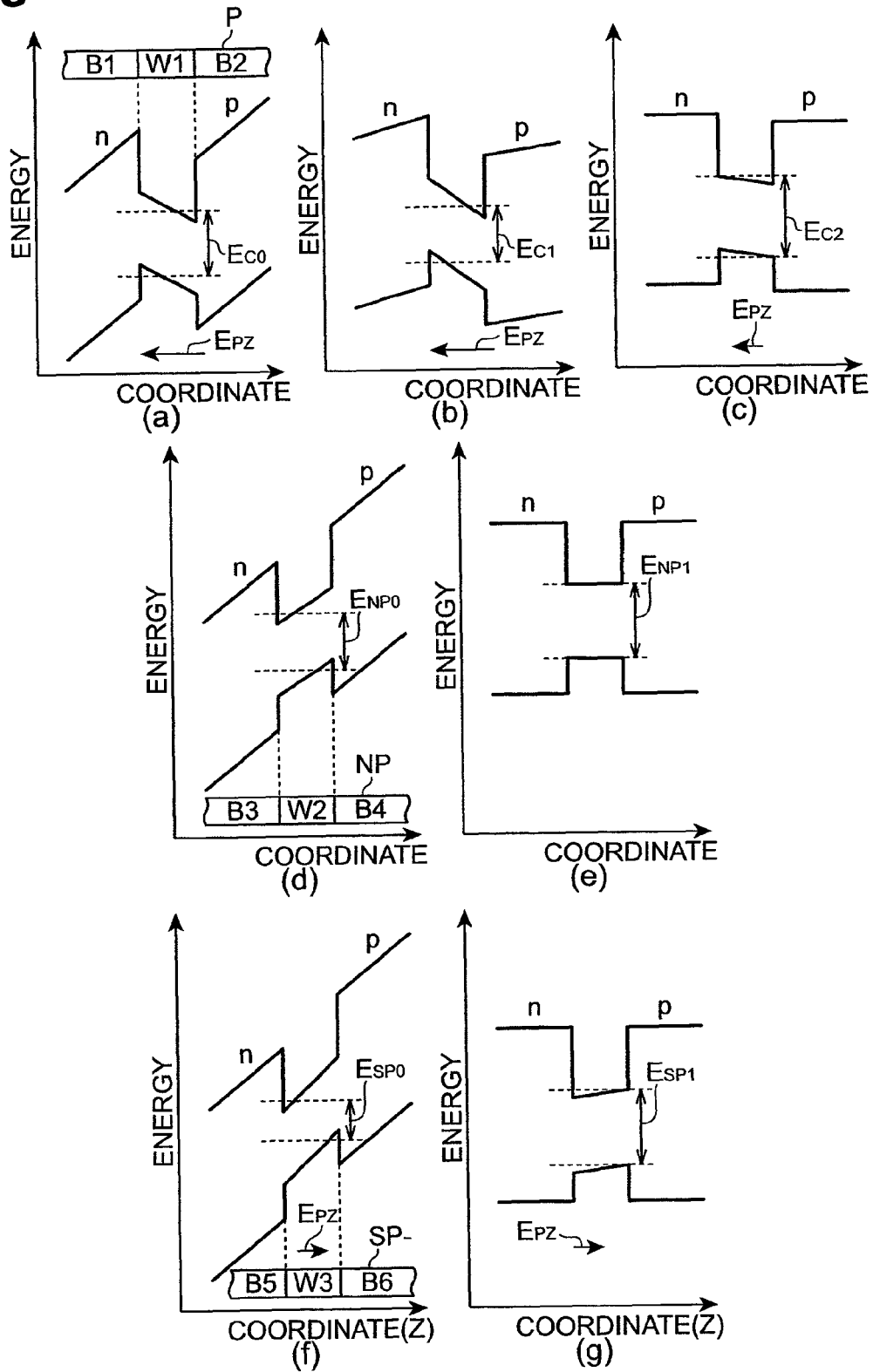
FIG. 16 is a drawing illustrating directions of piezo-electric fields of strained light-emitting layers.

FIG. 16 illustrates the directions of piezo-electric fields of strained light-emitting layers. Parts (a) to (c) of FIG. 16 illustrate piezoelectric polarization of a light-emitting layer formed on a polar surface (c-plane). Parts (d) and (e) of FIG. 16 illustrate piezoelectric polarization of a light-emitting layer formed on a non-polar surface (a-plane, m-plane). Parts (f) and (g) of FIG. 16 illustrate piezoelectric polarization of a light-emitting layer formed on a semipolar surface.

As shown in part (a) of FIG. 16, the light-emitting layer P includes a barrier layer B1, a well layer W1, and another barrier layer B2, which are formed in sequence over the polar surface (c-plane), and the well layer W1 is provided between the barrier layers B1 and B2. The direction of the piezoelectric field $E_{PZ}$ of the well layer W1 is oriented from the p-layer to the n-layer. In the well layer, the bottom of the conduction band and the bottom of the valence band slope down in a direction from the n-layer to the p-layer. The symbol $E_{C0}$ represents a difference in energy between the bottom of the conduction band and the bottom of the valence band. As shown in part (b) of FIG. 16, a low forward voltage is applied to the light-emitting layer P. The application of the voltage to the light-emitting layer P makes the slopes of the bottoms of the conduction band and the valence band steeper. The symbol $E_{C1}$ represents a difference in energy between the bottom of the conduction band and the bottom of the valence band. The difference $E_{C0}$ is greater than the difference $E_{C1}$. As shown in part (c) of FIG. 16, a high forward voltage is applied to the light-emitting layer P.

In this light-emitting layer, screening reduces the slope of bottoms of the conduction band and the valence band. The symbol $E_{C2}$ represents a difference in energy between the bottom of the conduction band and the bottom of the valence band. The difference $E_{C2}$ is greater than the difference $E_{C0}$. Such a change in the difference induced by an applied voltage causes a blue shift.

As shown in part (d) of FIG. 16, the light-emitting layer NP includes a barrier layer B3, a well layer W2, and another barrier layer B4, which are formed in sequence over the non-polar surface (a-plane, m-plane), and the well layer W2 is provided between the barrier layers B3 and B4. The well layer W2 is formed on the non-polar surface and thus has no piezo-electric field $E_{PZ}$ therein. In the well layer W2, the conduction band bottom and the valence band bottom slope down in a direction from the p-layer to the n-layer. The symbol $E_{NP0}$ represents a difference in energy between the bottom of the conduction band and the bottom of the valence band. As shown in part (e) of FIG. 16, a forward voltage is applied to the light-emitting layer N$_P$. In the light-emitting layer N$_P$, the application of the voltage results in substantially no slope of the conduction band bottom and the valence band bottom. The symbol $E_{NP1}$ represents a difference in energy between the bottom of the conduction band and the bottom of the valence band. The energy difference $E_{NP0}$ is smaller than the energy $E_{NP1}$. Since the light-emitting layer N$_P$ has no piezo-electric field, carriers in the well layer does not cause screening, if the amount of carriers increases. Consequently, the application of voltage does not make any change in the energy difference, resulting in no blue shift.

As shown in part (f) of FIG. 16, the light-emitting layer SP-includes a barrier layer B5, a well layer W3, and another barrier layer B6, which are formed in sequence over the semipolar surface tilting at a specific off-angle, and the well layer W3 are provided between layers B5 and B6. Since the well layer W3 is formed on the semipolar surface, the intensity of piezo-electric field $E_{PZ}$ is lower than that on the polar surface. In the well layer W3, the conduction band bottom and the valence band bottom slope down in a direction from the p-layer to the n-layer. The symbol $E_{SP0}$ represents a difference in energy between the bottom of the conduction band and the bottom of the valence band. As shown in part (g) of FIG. 16, a forward voltage is applied to the light-emitting layer SP-. The application of voltage to the light-emitting layer SP- makes the slopes of bottoms of the conduction band and the valence band smaller. The symbol $E_{NP1}$ represents a difference in energy between the bottom of the conduction band and the bottom of the valence band. The difference $E_{SP0}$ is smaller than the difference $E_{SP1}$. The piezo-electric field of the light-emitting layer SP- has a component opposite to the direction from the p-layer to n-layer, and the intensity of the component is lower than that on the polar surface, so that the extent of screening is made small. Consequently, the application of voltage causes a small change in the energy difference, resulting in a significantly small blue shift.

A well layer (light-emitting layer SP-) having a plane orientation of a tilt angle in accordance with the present embodiment behaves as shown in parts (f) and (g) of FIG. 16, whereas a well layer (light-emitting layer SP+) having a semipolar surface, which has plane orientation different from that of the tilt angle in accordance with the present embodiment, behaves as shown in parts (a) to (c) of FIG. 16.

Figure 17:
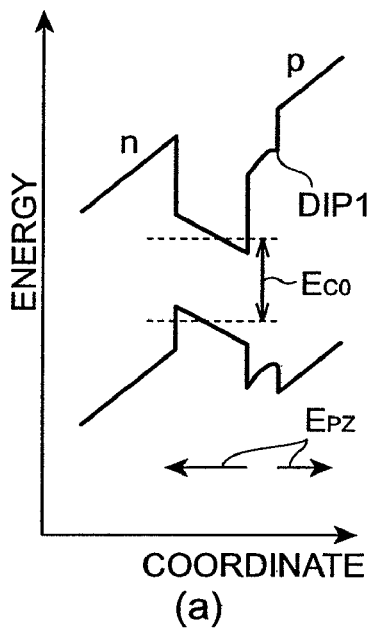
FIG. 17 is a drawing illustrating directions of piezo-electric fields of strained light-emitting layers.
Figure 17:
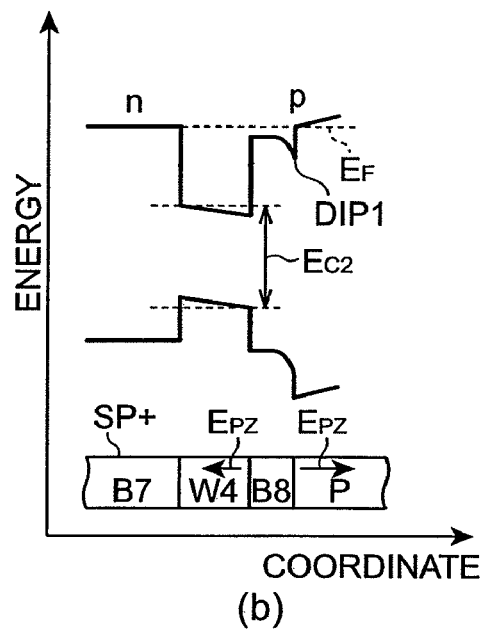
Figure 17:
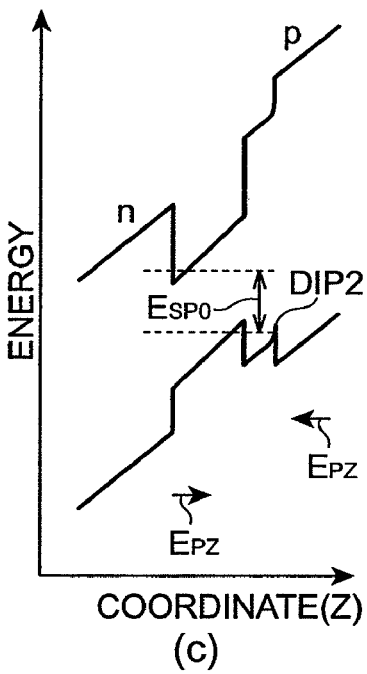
Figure 17:
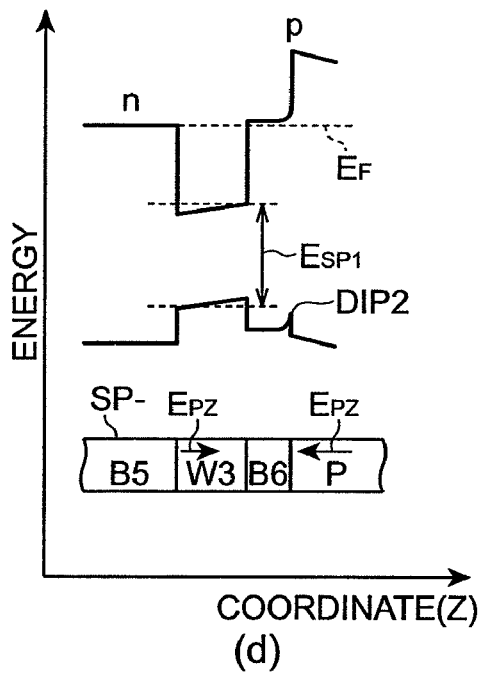

The light-emitting layers formed on the semipolar surface are further explained below. FIG. 17 illustrates the direction of piezoelectric polarization in strained light-emitting layers. Parts (a) and (b) of FIG. 17 represent a light-emitting layer SP+ having positive piezoelectric polarization. The light-emitting layer SP+ includes barrier layers B7 and B8 and a well layer W4 provided between the barrier layers B7 and B8. A gallium nitride based semiconductor layer P is adjacent to the light-emitting layer SP+, and has a band gap greater than those of the barrier layers. The gallium nitride based semiconductor P can be, for example, a p-type electron blocking layer or p-type cladding layer. The direction of the piezoelectric field in the well layer W4 is in a direction from the p-layer to the n-layer, while the direction of the piezo-electric field in the gallium nitride based semiconductor layer P is in a direction from the n-layer to the p-layer. At the interface between the light-emitting layer SP+ and the gallium nitride based semiconductor P, a dip DIP1 is formed in the conduction band. Such a dip DIP1 reduces the electron barrier of the gallium nitride based semiconductor layer P. The magnitude of the dip DIP1 is, for example, about 0.2 eV.

Parts (c) and (d) of FIG. 17 illustrate a light-emitting layer SP- having negative piezoelectric polarization. A gallium nitride based semiconductor layer P is adjacent to the light-emitting layer SP-, and has a band gap greater than those of the barrier layers. The piezo-electric field of the well layer W3 extends in a direction from the n-layer to the p-layer while the piezo-electric field of the gallium nitride based semiconductor layer P extends in a direction from the p-layer to the p-layer. At the interface between the light-emitting layer SP- and the gallium nitride based semiconductor P, a dip DIP2 is not generated in the conduction band but in the valence band. Such a dip like the dip DIP2 in the conduction band does not reduce the barrier against electrons coming from the light-emitting layer, and thus the gallium nitride based semiconductor P can sufficiently block electrons from the light-emitting layer. The magnitude of the dip DIP2 is, for example, about 0.1 eV.

It has demonstrated that the application of characteristics associated with the piezoelectric polarization in the group III nitride light-emitting device are the useful. The contributions of the piezoelectric polarization described above are meant to be exemplary, and are not be limited thereto.

As explained above, the method of making a semiconductor light-emitting device is provide, and this method enables the selection of an appropriate orientation of piezoelectric polarization in an active layer.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A method of making a semiconductor light-emitting device, the method comprising the steps of:
   selecting one or more tilt angles for a primary surface of a substrate of a group III nitride semiconductor in order to estimate a direction of piezoelectric polarization in a light-emitting layer;
   preparing one or more substrates, a primary surface of each substrate comprising the group III nitride semiconductor, the one or more substrates having the one or more selected tilt angles, respectively;
   growing a quantum well structure for the light-emitting layer, and p- and n-type gallium nitride semiconductor layers in order to prepare one or more substrate products for the selected tilt angles;
   measuring a photoluminescence spectrum of each substrate product while applying a bias to the substrate product, to determine bias dependence of the photoluminescence spectrum;
   evaluating a direction of the piezoelectric polarization in the light-emitting layer at the selected tilt angle on the primary surface of each substrate from the determined bias dependence;
   selecting a plane orientation of a growth substrate by determining which of the primary surface or a back surface of the substrate is to be used for a tilt angle for the semiconductor light-emitting device, the determination being made using the evaluation, the back surface being opposite to the primary surface, and the growth substrate being prepared for making the semiconductor light-emitting device; and
   forming a semiconductor laminate for the semiconductor light-emitting device on the primary surface of the growth substrate,
   the primary surface of the growth substrate comprising the group III nitride semiconductor,
   the tilt angle being defined by an angle between the primary surface of the substrate and the (0001) plane of the group III nitride semiconductor,
   the semiconductor laminate comprising a first group III nitride semiconductor region, a light-emitting layer, and a second group III nitride semiconductor region,
   the light-emitting layer being provided between the first group III nitride semiconductor region and the second group III nitride semiconductor region,
   the light emitting layer comprising a well layer and a barrier layer,
   each of the well layer and the barrier layer extending along a reference plane, the reference plane tilting with respect to a plane perpendicular to a reference axis, and the reference axis extending in a direction of the c-axis of the group III nitride semiconductor,
   the well layer comprising a first gallium nitride semiconductor and being strained,
   the barrier layer comprising a second gallium nitride semiconductor, and the second gallium nitride semiconductor being differing from the first gallium nitride semiconductor,
   the first group III nitride semiconductor region comprising at least one n-type group III nitride semiconductor layer, and
   the second group III nitride semiconductor region comprising at least one p-type group III nitride semiconductor layer.

2. The method according to claim 1, further comprising the step of segmenting a tilt angle range according to a positive or negative sign of the piezoelectric polarization by utilizing the evaluation of the direction of the piezoelectric polarization, the selected tilt angles being in the tilt angle range, and the determination being carried out using the segmentation.

3. The method according to claim 1, wherein the substrate product is fabricated using a group III nitride substrate.

4. The method according to claim 1, wherein an emission wavelength of the light-emitting layer is in a range of 460 nm to 550 nm.

5. The method according to claim 1, wherein plural tilt angles indicating two or more plane orientations are selected in the step of selecting one or more tilt angles.

6. The method according to claim 1, wherein a plane orientation of the growth substrate tilts in a range of 40 degrees to 140 degrees.

7. The method according to claim 1,
   wherein the well layer comprises InGaN,
   the barrier layer comprises one of InGaN and GaN,
   the well layer has a compressive strain caused by a stress from the barrier layer, and
   the substrate product is fabricated using a GaN substrate.

8. The method according to claim 1, wherein the primary surface of the growth substrate is selected such that the direction of the piezoelectric polarization is oriented in a direction from the n-type group III nitride semiconductor layer to the p-type group III nitride semiconductor layer.

9. The method according to claim 1, wherein the light-emitting layer has a multiple-quantum well structure, and a difference between a band gap of the barrier layer and a band gap of the well layer is equal to or more than 0.7 eV.

10. The method according to claim 1, further comprising the step of, if the evaluation shows that the piezoelectric polarization is in a positive direction from the n-type group III nitride semiconductor layer to the p-type group III nitride semiconductor layer in a part or whole of a tilt angle range, preparing a substrate for the growth substrate, the prepared substrate having a primary surface of a tilt angle, the tilt angle indicating the positive direction of the piezoelectric polarization, and the selected tilt angles being in the tilt angle range.

11. The method according to claim 1, further comprising the step of, if the evaluation shows that the piezoelectric polarization is in a negative direction from the p-type group III nitride semiconductor layer to the n-type group III nitride semiconductor layer in a part or whole of a tilt angle range, preparing a substrate for the growth substrate, the substrate having a primary surface, the primary surface corresponding to a plane orientation opposite to that of a tilt angle, the tilt angle indicating the negative direction of the piezoelectric polarization, and the selected tilt angles being in the tilt angle range.

12. The method according to claim 1, wherein a plane orientation of the growth substrate is in an angle range of 40 degrees to 50 degrees or 90 degrees to 130 degrees, and the substrate product is fabricated using a GaN substrate.

13. The method according to claim 10, wherein a plane orientation of the growth substrate is any one of the (10-12) plane, (11-2-2) plane, (10-1-1) plane, and (20-2-1) plane.

14. The method according to claim 10, wherein the primary surface of the growth substrate is selected such that the direction of the piezoelectric polarization is in a direction from the p-type group III nitride semiconductor layer to the n-type group III nitride semiconductor layer.

15. The method according to claim 1, further comprising the step of, if the evaluation shows that the piezoelectric polarization is in a positive direction from the n-type group III nitride semiconductor layer to the p-type group III nitride semiconductor layer in a part or whole of a tilt angle range, preparing a substrate for the growth substrate, the substrate having a primary surface, the primary surface corresponding to a plane orientation opposite to that of a tilt angle, the tilt angle indicating a positive direction of the piezoelectric polarization, and the selected tilt angles being in the tilt angle range.

16. The method according to claim 1, further comprising a step of, if the evaluation shows that the piezoelectric polarization is in a negative direction from the p-type group III nitride semiconductor layer to the n-type group III nitride semiconductor layer in a part or whole of a tilt angle range, preparing a substrate for the growth substrate, the substrate having a primary surface of a tilt angle, and the tilt angle indicating a negative direction of the piezoelectric polarization.

17. The method according to claim 1,
wherein the second group III nitride semiconductor region includes a gallium nitride based semiconductor layer having a band gap greater than that of the barrier layer, the gallium nitride based semiconductor layer in the second group III nitride semiconductor region is adjacent to the light-emitting layer,
the gallium nitride based semiconductor layer includes an electron blocking layer,
the primary surface of the growth substrate has an angle in a range of 63 degrees to 80 degrees, and
the substrate product is fabricated using a GaN substrate.

18. The method according to claim 1, wherein a plane orientation of the growth substrate is a {20-21} plane.

19. The method according to claim 1, wherein the tilt angle is defined as an angle at which a c-axis of the group III nitride semiconductor is tilted toward an m-axis of the group III nitride semiconductor.

20. The method according to claim 1, wherein the tilt angle is defined as an angle at which a c-axis of the group III nitride semiconductor is tilted toward an a-axis of the group III nitride semiconductor.

* * * * *